United States Patent
Kimachi et al.

(10) Patent No.: US 7,145,417 B2
(45) Date of Patent: Dec. 5, 2006

(54) FILTER CHIP AND FILTER DEVICE

(75) Inventors: Rei Kimachi, Ibaraki (JP); Tokihiro Nishihara, Kawasaki (JP); Takeshi Sakashita, Kawasaki (JP); Tsuyoshi Yokoyama, Kawasaki (JP); Tsutomu Miyashita, Kawasaki (JP)

(73) Assignees: Fujitsu Limited, Kawasaki (JP); Fujitsu Media Devices Limited, Yokohama (JP)

( * ) Notice: Subject to any disclaimer, the term of this patent is extended or adjusted under 35 U.S.C. 154(b) by 520 days.

(21) Appl. No.: 10/397,172

(22) Filed: Mar. 27, 2003

(65) Prior Publication Data

US 2003/0186673 A1    Oct. 2, 2003

(30) Foreign Application Priority Data

Mar. 29, 2002  (JP)  ............................. 2002-097083

(51) Int. Cl.
  *H03H 9/54*  (2006.01)
  *H03H 9/64*  (2006.01)
(52) U.S. Cl. .................................. 333/189; 333/193
(58) Field of Classification Search ............ 333/193, 333/189, 133
  See application file for complete search history.

(56) References Cited

U.S. PATENT DOCUMENTS

| | | | | |
|---|---|---|---|---|
| 5,231,327 A | * | 7/1993 | Ketchum ................... | 310/366 |
| 5,905,418 A | * | 5/1999 | Ehara et al. ............... | 333/193 |
| 5,942,958 A | * | 8/1999 | Lakin ........................ | 333/189 |
| 6,043,585 A | * | 3/2000 | Plessky et al. .......... | 310/313 R |
| 6,150,904 A | * | 11/2000 | Taniguchi et al. .......... | 333/193 |
| 6,323,744 B1 | * | 11/2001 | Barber et al. ............... | 333/189 |
| 6,445,261 B1 | * | 9/2002 | Yuda et al. ................. | 333/133 |
| 6,677,835 B1 | * | 1/2004 | Noguchi et al. ............ | 333/193 |
| 6,741,145 B1 | * | 5/2004 | Tikka et al. ................ | 333/133 |
| 6,747,530 B1 | * | 6/2004 | Selmeier ..................... | 333/193 |
| 2002/0000897 A1 | | 1/2002 | Huor | |

FOREIGN PATENT DOCUMENTS

| | | |
|---|---|---|
| CN | 1167370 | 12/1997 |
| CN | 1168569 | 12/1997 |
| CN | 1202041 | 12/1998 |
| CN | 1213890 | 4/1999 |
| JP | 5-183380 | 7/1993 |
| JP | 9-261002 | * 10/1997 |
| JP | 10-93382 | * 4/1998 |
| JP | 0 865 157 A2 | 9/1998 |
| JP | 10270979 | 10/1998 |
| JP | 2000196400 | 7/2000 |
| JP | 2000-312127 | * 11/2000 |
| JP | 2001024476 | 1/2001 |
| JP | 2001-156586 | * 6/2001 |

OTHER PUBLICATIONS

Japanese Office Action dated May 5, 2006.
German Office Action dated Jun. 23, 2006.
Chinese Office Action dated Jul. 7, 2006.

* cited by examiner

*Primary Examiner*—Barbara Summons
(74) *Attorney, Agent, or Firm*—Arent Fox PLLC

(57) ABSTRACT

A filter chip includes multiple series-arm resonators arranged in series arms of a ladder arrangement, and multiple parallel-arm resonators arranged in parallel arms of the ladder arrangement. A common line is connected to first electrodes of at least two parallel-arm resonators among the multiple parallel-arm resonators. Second electrodes of said at least two parallel-arm resonators are connected to associated series-arm resonators among the multiple series-arm resonators.

24 Claims, 27 Drawing Sheets

FILTER CHIP AND FILTER DEVICE

BACKGROUND OF THE INVENTION

1. Field of the invention

The present invention generally relates to filter chips, and more particularly, to a filter chip having multiple resonators arranged in a ladder formation and a filter device equipped with such a filter chip.

2. Description of the Related Art

A band-pass filter is employed at a radio frequency (RF) stage of a portable or mobile wireless apparatus such as a cellular phone. Generally, such a band-pass filter is required to have a degree of suppression to out-of-pass-band frequencies as high as 20 dB to 40 dB. Conventionally, the band-pass filter widely used has a structure in which multiple surface acoustic wave resonators are arranged in a ladder formation. Various ways to improve the degree of suppression to the out-of-pass-band frequencies have been proposed in connection with the ladder-type filter.

For example, it is proposed to increase the number of stages of resonators in the ladder arrangement. It is also proposed to increase the ratio Cp/Cs where Cs denotes the electrostatic capacitance of the resonator arranged in a series arm of the ladder arrangement, and Cp denotes the electrostatic capacitance of the resonator arranged in a parallel arm thereof. However, these proposals increase insertion loss in the pass band.

Another proposal based on the above consideration is known. According to this proposal, inductance elements are added to the resonators in the parallel arm in order to reduce the insertion loss in the pass band and simultaneously enhance the effect of suppression to the out-of-pass-band frequencies. More particularly, a wire is used to connect a ground electrode in each of the parallel-arm resonators in the ladder arrangement and a ground pad on a package (see, for example, Japanese Unexamined Patent Publication No. 5-183380).

However, it is not expected that the use of wire for making a connection between the filter chip and the package to thus obtain a desired inductance provides the sufficient degree of suppression to the frequencies out of the pass band in flip-chip or face-down mounting in which bumps having a smaller inductance than that of the wire are used as a connecting member for making an external connection.

SUMMARY OF THE INVENTION

It is a general object of the present invention to provide a filter chip and a filter device equipped with the filter chip in which the above disadvantages are eliminated.

A more specific object of the present invention is to provide a filter chip and a filter device having a high degree of suppression to frequencies out of the pass band even when a connecting member having a relatively small inductance is used to make an external connection.

The above objects of the present invention are achieved by a filter chip comprising: multiple series-arm resonators arranged in series arms of a ladder arrangement; multiple parallel-arm resonators arranged in parallel arms of the ladder arrangement; and a common line connected to first electrodes of at least two parallel-arm resonators among the multiple parallel-arm resonators, second electrodes of said at least two parallel-arm resonators being connected to associated series-arm resonators among the multiple series-arm resonators. The filter chip operates with a combined inductance including the inductance of the common line and that of the connecting member. Preferably, the common line has a ring shape provided so as to surround the multiple series-arm resonators and the multiple parallel-arm resonators.

The above objects of the present invention are also achieved by a filter device comprising: a package; and a filter chip accommodated in the package, the filter chip comprising: multiple series-arm resonators arranged in series arms of a ladder arrangement; multiple parallel-arm resonators arranged in parallel arms of the ladder arrangement; and a common line connected to first electrodes of at least two parallel-arm resonators among the multiple parallel-arm resonators, second electrodes of said at least two parallel-arm resonators being connected to associated series-arm resonators among the multiple series-arm resonators, the common line being connected to pads provided on the package by connecting members.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to the accompanying drawings, of embodiments of the present invention.

Figure 1:
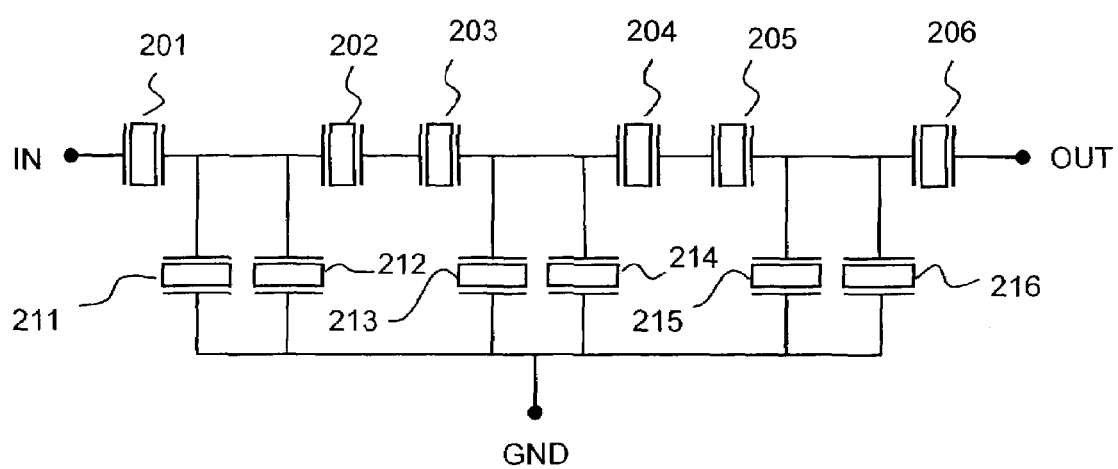
FIG. 1 a circuit diagram of a filter having multiple resonators arranged in a ladder formation.

A filter chip according to an embodiment of the present invention has an electrical structure shown in FIG. 1. The filter shown in FIG. 1 is a band-pass filter having a given pass band.

Referring to FIG. 1, multiple resonators are arranged in a ladder formation, wherein multiple resonators 201, 202, 203, 204, 205 and 206 are provided in series arms of the ladder structure and multiple resonators 211, 212, 213, 214, 215 and 216 are arranged in parallel arms thereof. Hereinafter, resonators arranged in series arms are referred to as series-arm resonators, and those arranged in parallel arms are referred to as parallel-arm resonators. The parallel-arm resonators 211–216 are connected between signal lines in the series arms and a common line. The series-arm resonators 201–206 are aligned with the parallel-arm resonators 211–216, respectively.

The filter thus configured is used so that the common line to which the parallel-arm resonators 211–216 are connected is directly grounded or grounded via appropriate inductance elements. When a signal IN is applied to the series-arm resonator 201 of the first stage, a frequency-adjusted output signal OUT is available from the series-arm resonator 206 of the final stage.

Figure 2:
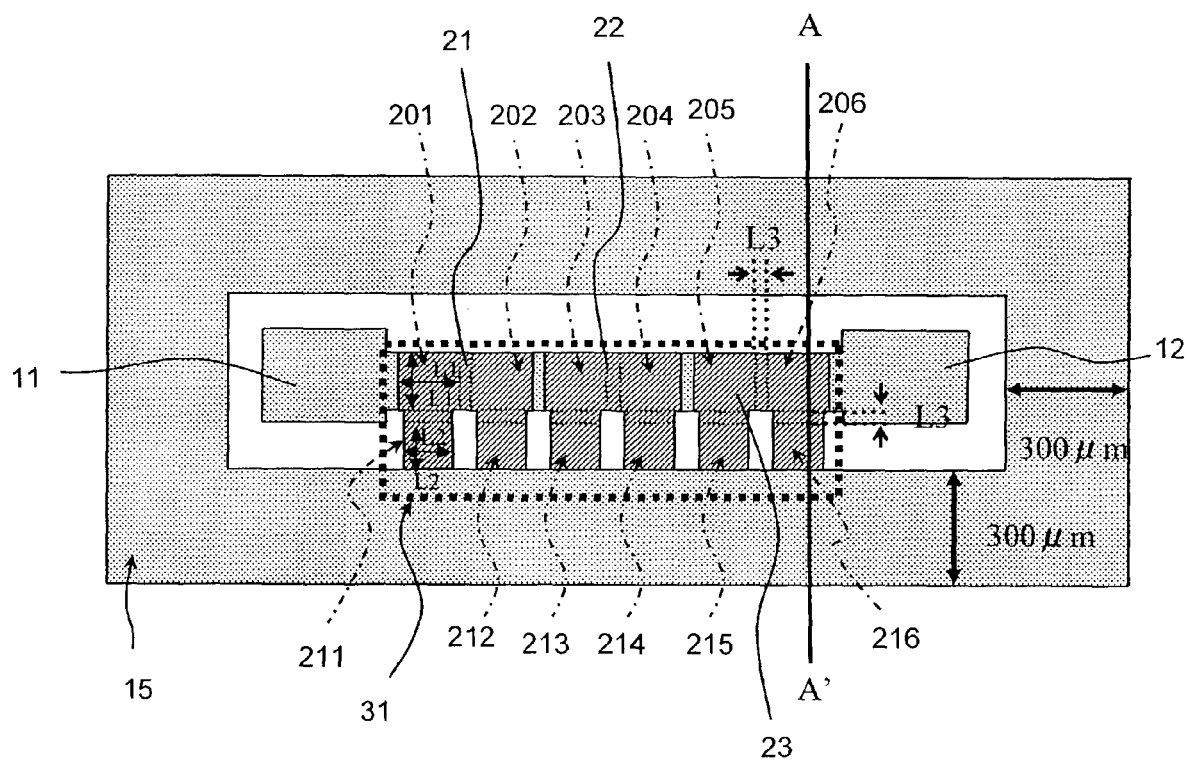
FIG. 2 is a plan view of a filter chip according to a first embodiment of the present invention.
Figure 3:
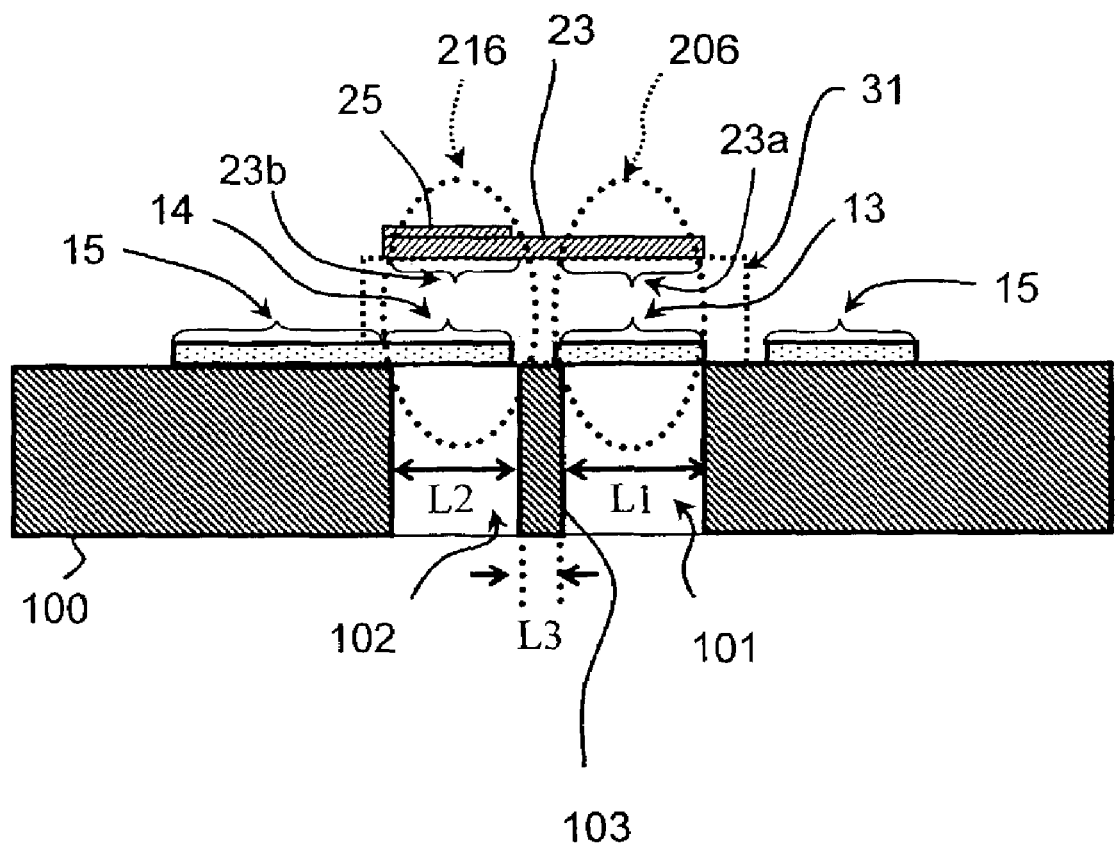
FIG. 3 is a cross-sectional view taken along a ling A–A' shown in FIG. 2.

The filter chip that implements the circuit configuration shown in FIG. 1 has a structure as shown in FIGS. 2 and 3. FIG. 2 is a plan view of the filter chip, and FIG. 3 is a cross-sectional view taken along a line A–A' shown in FIG. 2. Now, the detail of the structure shown in FIGS. 2 and 3 will be described as a first embodiment of the present invention. The resonators of the filter chip are piezoelectric thin-film resonators.

Referring to FIGS. 2 and 3, the series-arm resonators 201–206 and the parallel-arm resonators 211–216 are formed on a silicon (Si) substrate 100. Each of the resonators 201–206 and 211–216 is a piezoelectric thin-film resonator, which is composed of an upper electrode, a lower electrode and a piezoelectric film sandwiched therebetween.

A lower electrode film is provided on the silicon substrate 100, and is used to form an input electrode 11, an output electrode 12, the lower electrode of each resonator, and a common line 15. The series-arm resonators 201–206 are arranged in line between the input electrode 11 and the output electrode 12. As is shown in FIG. 3, the series-arm resonator 206 is formed by the lower electrode 13, the piezoelectric film 31, and a portion 23a of the upper electrode 23 that faces the lower electrode 13. The parallel-arm resonator 216 is formed by the lower electrode 14, the piezoelectric film 31 and a portion 23b of the upper piezoelectric film 23 that faces the lower electrode 14.

An upper electrode 21 forms the upper electrodes of four resonators, namely, the series-arm resonators 201 and 202 and the parallel-arm resonators 211 and 212. Similarly, an upper electrode 22 forms the upper electrodes of four resonators, namely, the series-arm resonators 203 and 204 and the parallel-arm resonators 213 and 214. An upper electrode 23 forms the upper electrodes (including the portions 23a and 23b shown in FIG. 3) of four resonators, namely, the series-arm resonators 205 and 206 and the parallel-arm resonators 215 and 216. The lower electrode of the series-arm resonator 201 is integrally formed with the input electrode 11, and the lower electrode (indicated by reference numeral 13 in FIG. 3) of the series-arm resonator 206 is integrally formed with the output electrode 12. The lower electrodes of the series-arm resonators 202 and 203 are integrally formed, and the lower electrodes of the series-arm resonators 204 and 205 are integrally formed.

With the above-mentioned electrode arrangement, the band-pass filter having the ladder-type circuit configuration shown in FIG. 1 is realized on the filter chip.

The common line 15 formed by the lower electrode film is integrally formed with the lower electrodes (which are, for example, the lower electrode 14) of the parallel-arm resonators 211–216. The common line 15 has an approximately ring shape on the silicon substrate 100 and surrounds the series-arm resonators 201–206, the parallel-arm resonators 211–216, the input electrode 11 and the output electrode 12.

A conductive film layer 25 for frequency adjustment is provided on the upper electrodes of the parallel-arm resonators 211–216. In FIG. 3, the conductive film layer 25 is provided on the upper electrode 23b. A cavity 101 is formed so that it reaches the lower electrode 13 of the series-arm resonator 206, which lower electrode is thus exposed from the backside of the silicon substrate 100. The cavity 101 has a rectangular cross section having a side of length L1. For each of the other series-arm resonators 201–205, the same cavity as the cavity 101 is provided in the silicon substrate 100. Similarly, a cavity 102 is formed so that it reaches the lower electrode 14 of the parallel-arm resonator 216, which electrode is thus exposed from the backside of the silicon substrate 100. The cavity 102 has a rectangular cross section having a side of length L2. For each of the other parallel-arm resonators 211–215, the same cavity as the cavity 102 is provided in the silicon substrate 100.

In the silicon substrate 100, the cavities 101 are formed just below the series-arm resonators 201–206, and the cavities 102 are formed just below the parallel-arm resonators 211–216. A boundary portion between the cavities 101 below two adjacent series-arm resonators is also a partition wall 103 having a thickness L3. Similarly, a boundary portion between the cavity 101 below a series-arm resonator and the cavity 102 below a parallel-arm resonator is a partition wall 103 having the thickness L3. The structure of the silicon substrate 100 equipped with the resonators and the cavities provides a resonator or filter as a whole.

The frequency characteristic of the filter serving as the band-pass filter in this embodiment depends on the physical shapes of the cavities 101 formed just below the series-arm resonators 201–206, the cavities 102 formed just below the parallel-arm resonators 211–216, and the partition walls 103 in addition to the conductive film layer 25 for frequency adjustment.

For example, the common line 15 is 300 μm, and the length L1 of one side of each cavity 101 is 65 μm. The length L2 of one side of each cavity 102 is 50 μm, and the thickness L3 of each partition wall 103 is 20 μm.

The above-mentioned filter chip can be fabricated by a sequence of steps shown in FIGS. 4 through 10.

Figure 4:
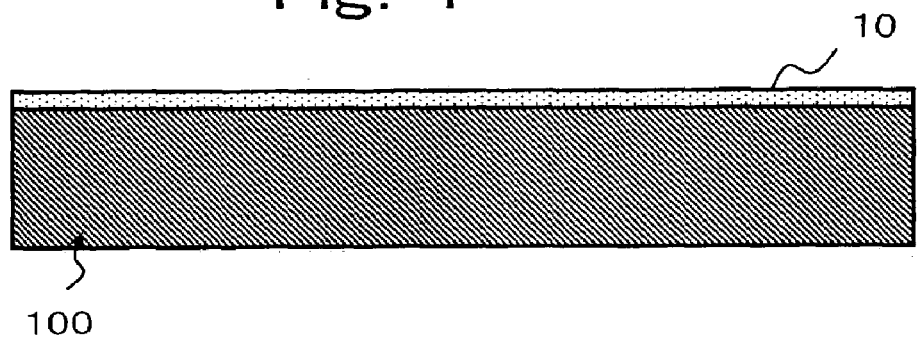
FIG. 4 illustrates the first step of a method of fabricating the filter chip shown in FIGS. 2 and 3 according to an embodiment of the present invention.
Figure 5:
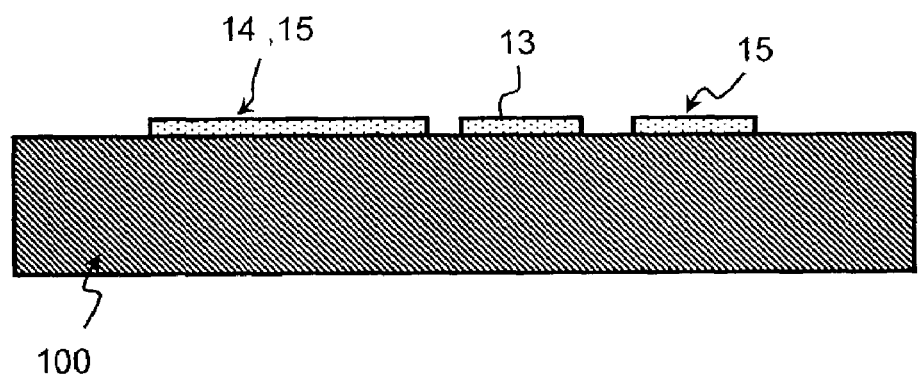
FIG. 5 illustrates of the second step of the fabrication method.

Referring to FIG. 4, a laminate of conductive thin-films is grown, by sputtering, on a (111)-cut silicon substrate 100, which is 300 μm thick. This laminate serves as the lower electrode film 10. The conductive thin-films are respectively made of, for example, molybdenum (Mo) and aluminum (Al). For example, the molybdenum film is 100 nm thick, and the aluminum film is 50 nm thick. Next, the lower electrode film 10 is patterned into a given shape by a photolithographic process and a wet or dry etching process. This patterning results in the common line 15, the lower electrode (13, 14 and so on) of each resonator on the silicon substrate 100. The patterning also results in the input electrode 11 and the output electrode 12 shown in FIG. 2.

Figure 6:
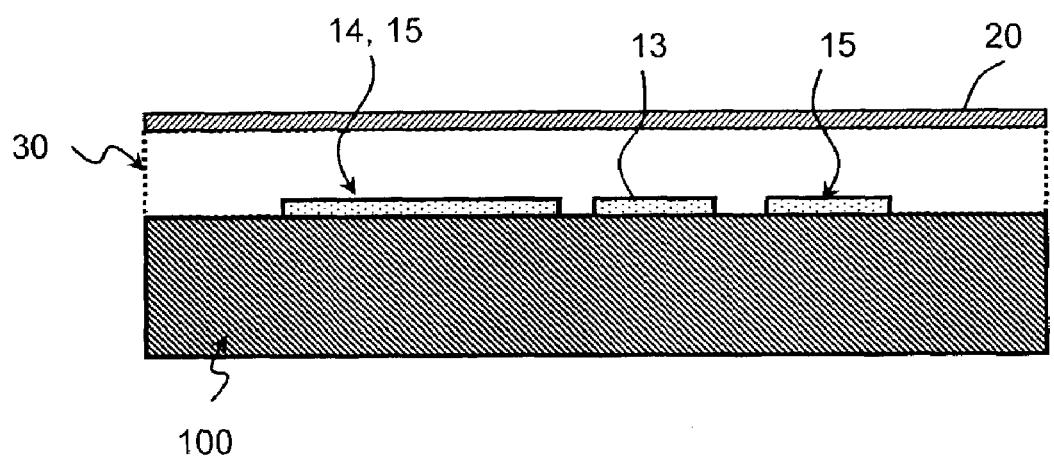
FIG. 6 illustrates the third step of the fabrication method.
Figure 7:
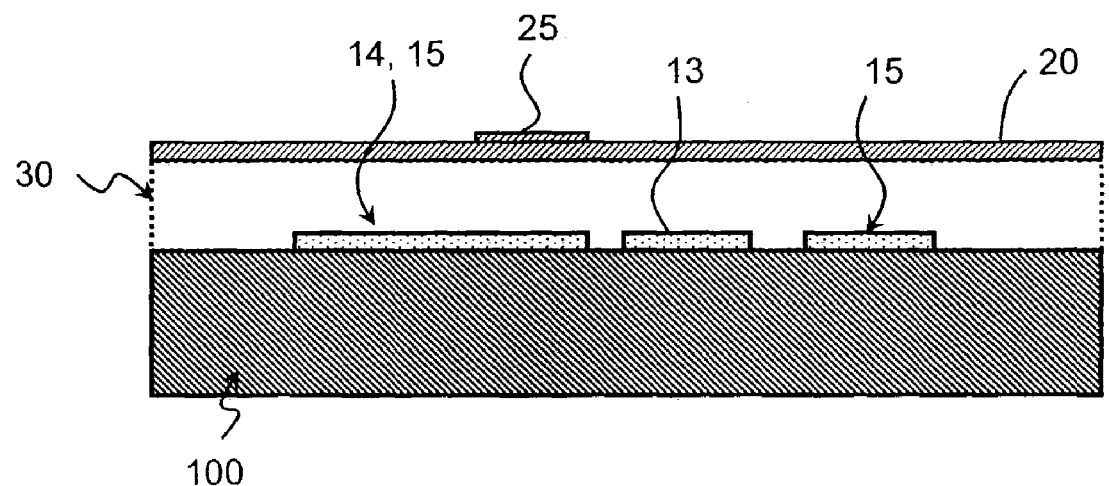
FIG. 7 illustrates the fourth step of the fabrication method.

After patterning of the lower electrode film 10 is completed, as shown in FIG. 6, a film of aluminum nitride (AlN) serving as a piezoelectric film 30 is grown so as to cover the silicon substrate 100 and the patterned lower electrode film 10. For example, the piezoelectric film 30 is deposited to a thickness of 500 nm by sputtering. Then, a conductive film of, for example, molybdenum is grown to a thickness of 100 nm on the piezoelectric film 30 by sputtering. The molybdenum film serves as the upper electrode film. Thereafter, as shown in FIG. 7, a film of aluminum is photolithographically deposited to a thickness of, for example, 50 nm on the upper electrode film 20. This aluminum film serves as the conductive film layer 25 for frequency adjustment.

Figure 8:
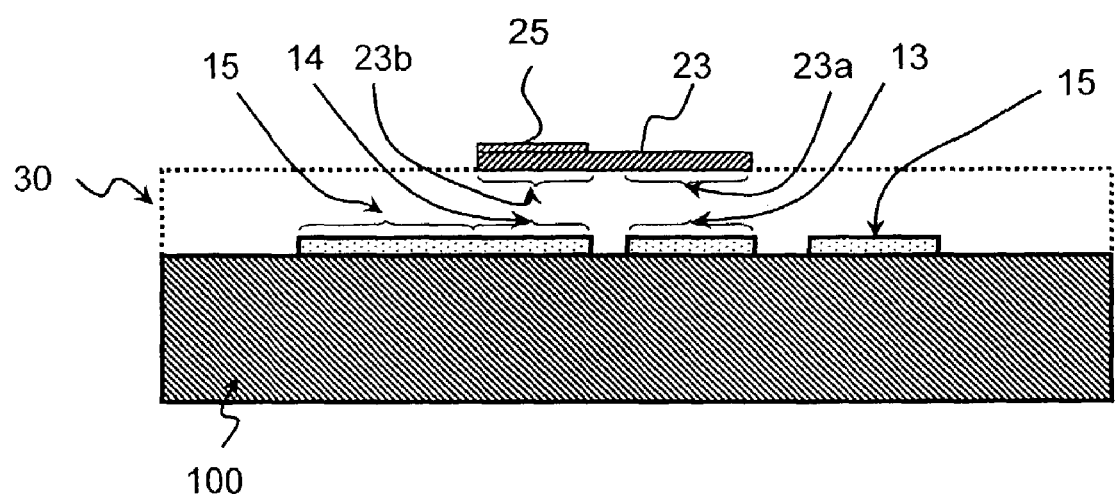
FIG. 8 illustrates the fifth step of the fabrication method.
Figure 9:
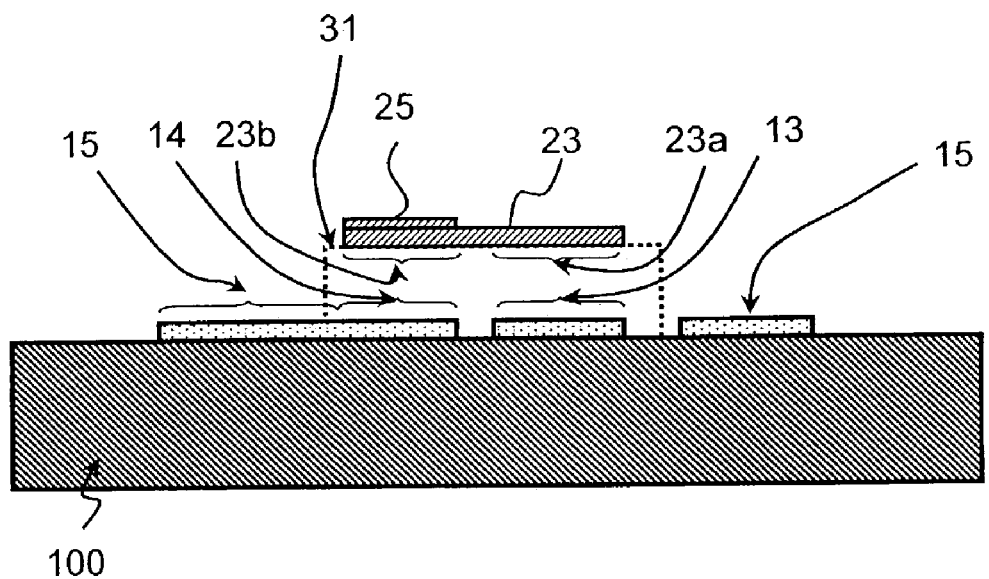
FIG. 9 illustrates the sixth step of the fabrication method.

As shown in FIG. 8, the upper electrode film 10 is patterned by the photolithographic process and the wet or dry etching process, so that the upper electrode 23 is formed. Of course, the other upper electrodes 23 shown in 2 are simultaneously formed. Then, as shown in FIG. 9, the piezoelectric film 30 is patterned by the photolithographic process and the wet or dry etching process. The lower electrode 13, the portion 23a of the upper electrode 23 that faces the lower electrode 13, and the piezoelectric film 31 sandwiched therebetween defines one series-arm resonator. The portion 23b of the upper electrode 23 just below the conductive layer 25 for frequency adjustment, the lower electrode 14 facing the portion 23b and the piezoelectric film 31 sandwiched therebetween defines one parallel-arm resonator.

Then, a resist pattern is photolithographically formed on the back surface of the silicon substrate 100 so as to face only the lower electrodes 13 and 14. The back surface of the silicon substrate is opposite to the front surface thereof on which the lower electrodes 13 and 14 are formed. Then, the back surface ((100) surface) of the silicon substrate 100 with the resist pattern being formed thereon is subject to dry or wet etching. This etching defines the cavities 101 and 102, each of which has a rectangular cross section and is located just below the corresponding lower electrode 13 or 14. The cavities 101 and 102 are separated via the partition walls 103.

Preferably, the electrode films formed on the filter chip such as the lower electrode film 10 and the upper electrode film are made of a material having a low resistance and a high acoustic impedance. From this viewpoint, each electrode film may be a single layer of molybdenum, a laminate of molybdenum and aluminum, or any another appropriate conductive material. The piezoelectric film 30 is not limited to aluminum nitride (AlN), but may be made of ZnO, PZT (Lead Zirconate Titanate), or $PbTiO_3$ (lead titanate). Another film for use in frequency adjustment or protection may be provided on the upper electrode. The filter chip according to the first embodiment of the present invention employs the electrodes having square shapes (L1×L1, L2×L2). However, the electrodes may have an arbitrary shape such as a rectangle, oval or circle.

According to the first embodiment of the present invention, the common line 15 integrally formed with the lower electrodes (for example, the lower electrode 14 shown in FIG. 3) of the parallel-arm resonators 211–216 has a ring shape. In contrast, according to a second embodiment of the present invention, as shown in FIG. 11, a common line 16 that is connected to the lower electrodes of the parallel-arm resonators 211–216 formed from the lower electrode film has a rectangular shape. The structure of the filter chip according to the second embodiment of the present invention is the same as that of the first embodiment thereof except the structure of the common line 16. The filter chip shown in FIG. 11 can be fabricated by the same process as shown in FIGS. 4 through 10. In patterning shown in FIG. 5, the lower electrode film 10 is shaped into the rectangle of the electrode line 16.

Figure 12:
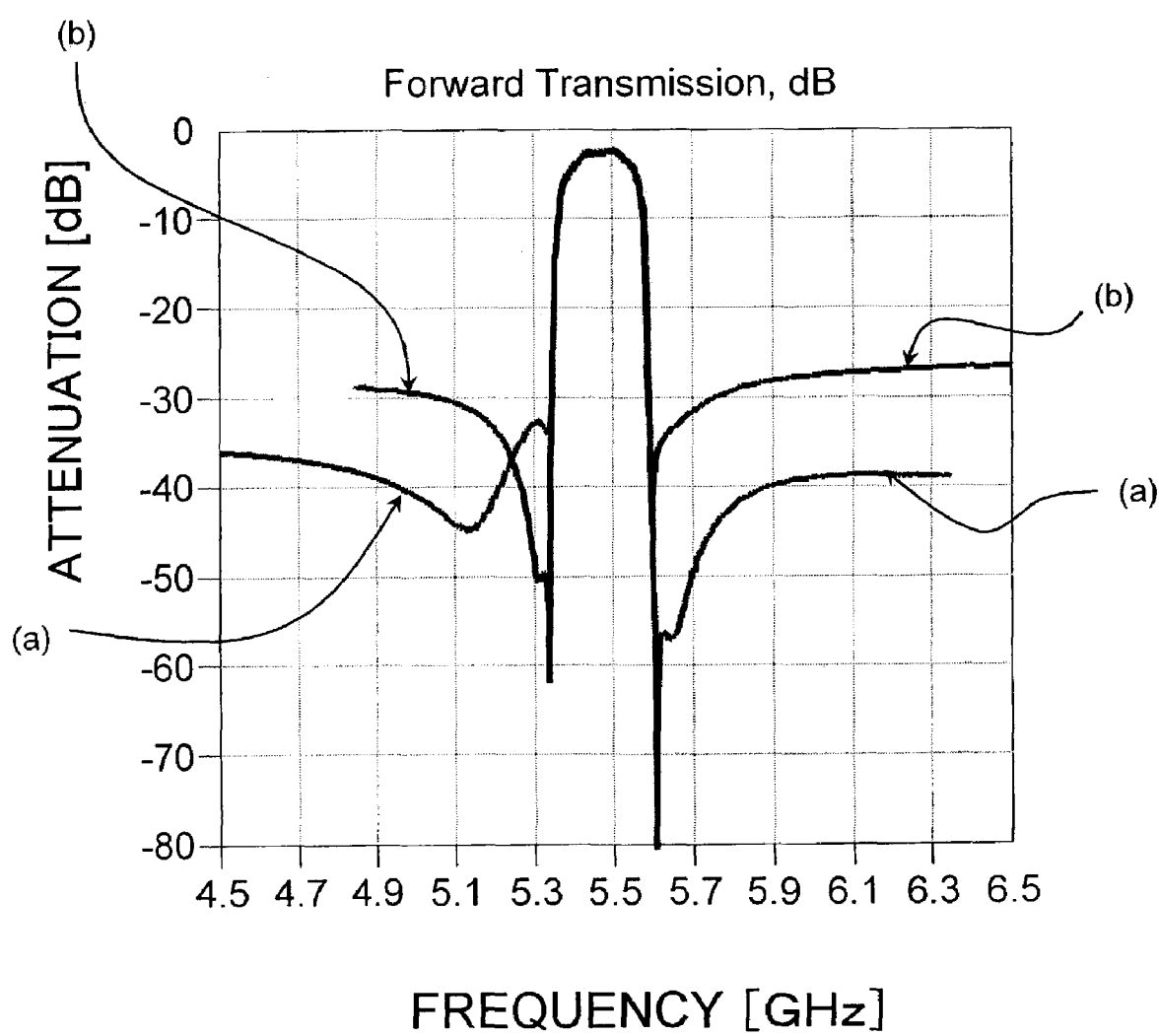
FIG. 12 is a graph of frequency characteristics of the filter ship shown in FIGS. 2 and 3 and the filter chip shown in FIG. 11.

A curve (a) shown in FIG. 12 is a pass-band frequency characteristic obtained when a signal is applied to the input electrode 11 in a state in which the common line 15 of the filter chip (band-pass filter) according to the first embodiment of the present invention is externally grounded. A curve (b) shown in FIG. 12 is a pass-band frequency characteristic obtained when a signal is applied to the input electrode 11 in a state in which the common line 16 of the filter chip (band-pass filter) according to the second embodiment of the present invention is externally grounded. It can be seen from comparison between the characteristic curves (a) and (b) that the ring-shaped common line 15 integrated with the lower electrodes of the parallel-arm resonators 211–216 enhances the degree of suppression to the frequencies out of the pass band (stop band attenuation) without degrading the minimum insertion loss.

A description will now be given of improvements in the out-of-pass-band frequencies by grounding the parallel-arm resonators of the band-pass filter arranged in ladder formation via inductance elements.

Figure 13:
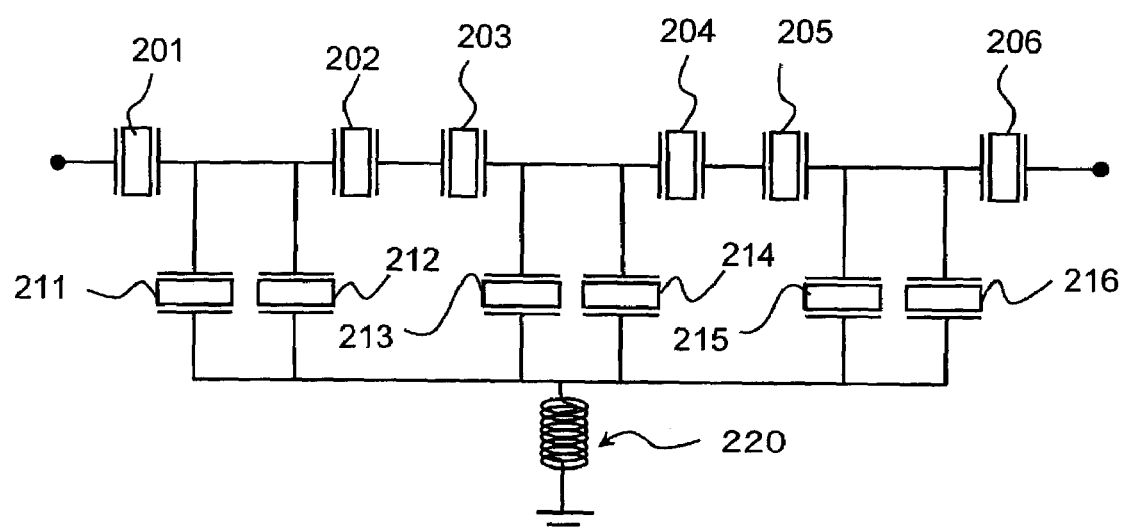
FIG. 13 is a circuit diagram of a circuit configuration in which an inductance element is connected to a band-pass filter.

The second embodiment of the present invention has a circuit configuration shown in FIG. 13 wherein all the parallel-arm resonators of the filter chip are connected to the common line 16 thereof, and the common line 16 is connected to a ground terminal outside of the filter chip via an inductance element.

Figure 14:
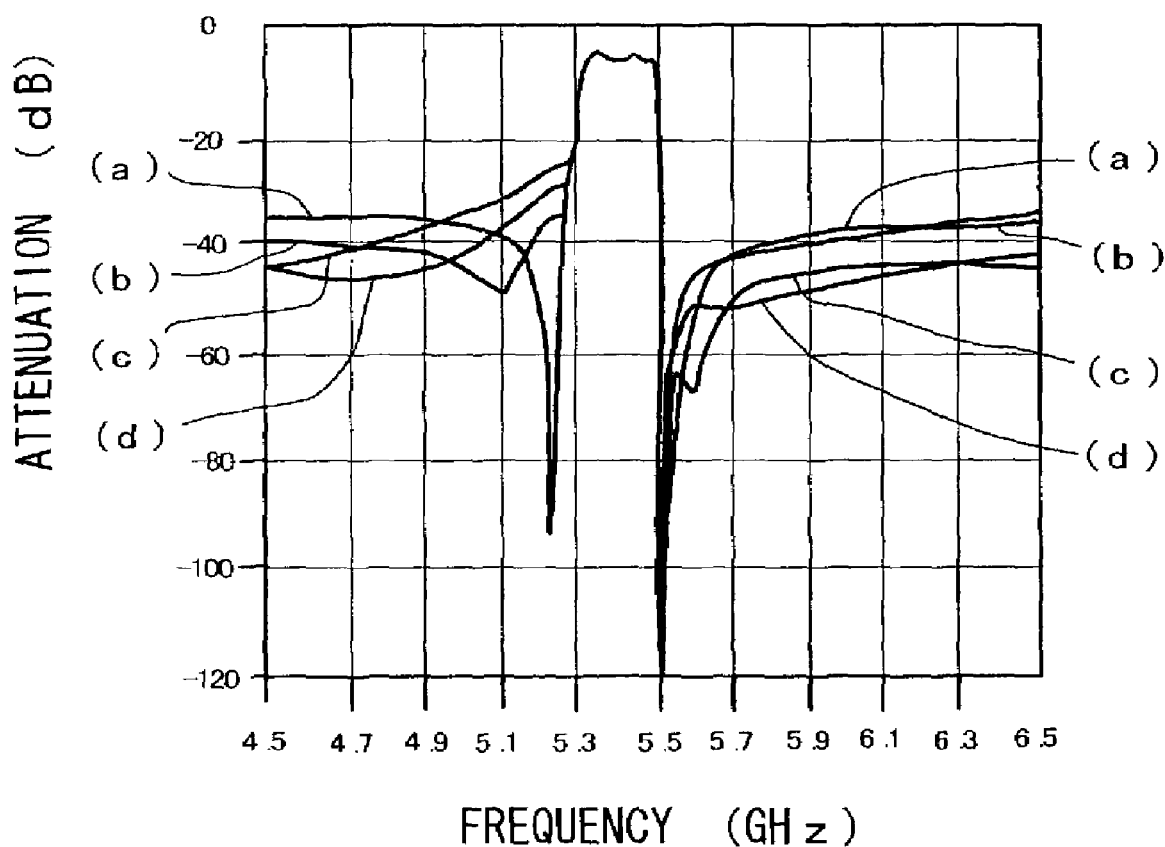
FIG. 14 shows results of simulating the frequency characteristics of the band-pass filter shown in FIG. 13.

FIG. 13 is a circuit diagram of an arrangement in which all the parallel-arm resonators are connected to the common line 16 in the filter chip, and the common line 16 is connected to an external ground terminal via an inductance element 220. FIG. 14 shows the results of simulation of the pass-band frequency characteristics obtained when the inductance element 220 commonly connected to the parallel-arm resonators 211–216 is stepwisely changed to have the following inductance values:

(a) 0 nH (the inductance element 220 is removed)
(b) 0.02 nH
(c) 0.04 nH
(d) 0.06 nH.

It can be seen from the simulation results that the degree of suppression to the out-of-pass-band frequencies is more greatly improved as the inductance element 220 connected to the parallel-arm resonators 211–216 has an increased value.

Figure 15:
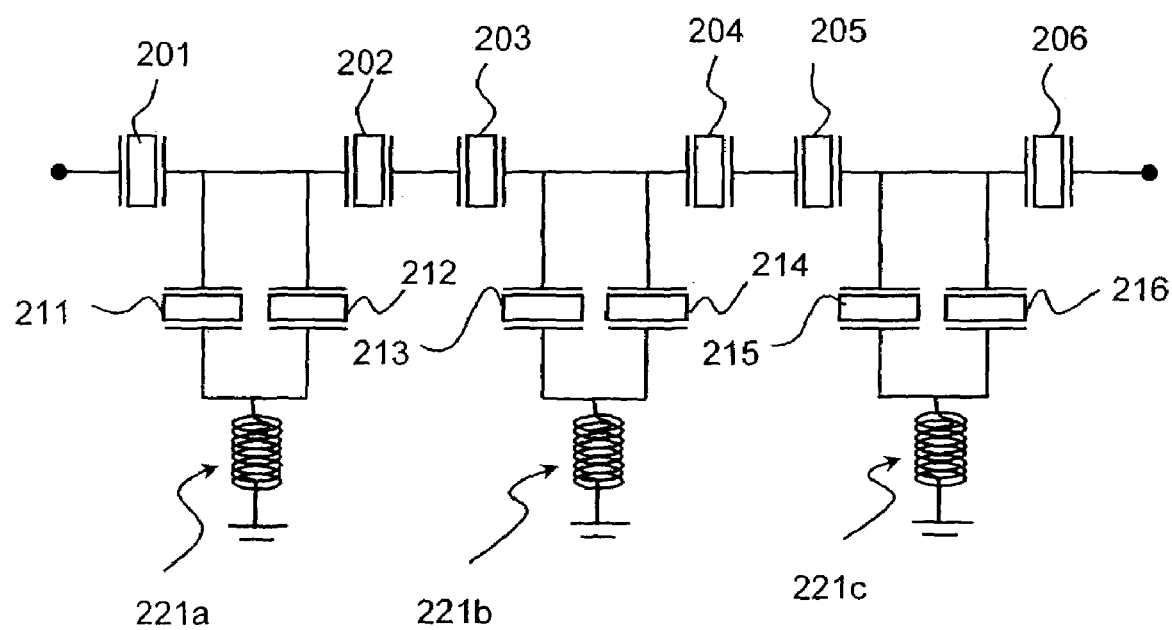
FIG. 15 is a circuit diagram of a circuit configuration in which inductance elements are connected to a band-pass filter.

FIG. 15 is a circuit diagram of an arrangement in which the parallel-arm resonators are grouped into pairs, and each of the pairs is connected to a respective common line, which is connected to a respective ground terminal via a respective inductance element. More particularly, the parallel-arm resonators 211 and 212 are connected to the corresponding ground terminal outside of the filter chip via an inductance element 221a. Similarly, the parallel-arm resonators 213 and 214 are connected to the corresponding ground terminal outside of the filter chip via an inductance element 221b, and the parallel-arm resonators 215 and 216 are connected to the corresponding ground terminal outside thereof via an inductance element 221c.

Figure 16:
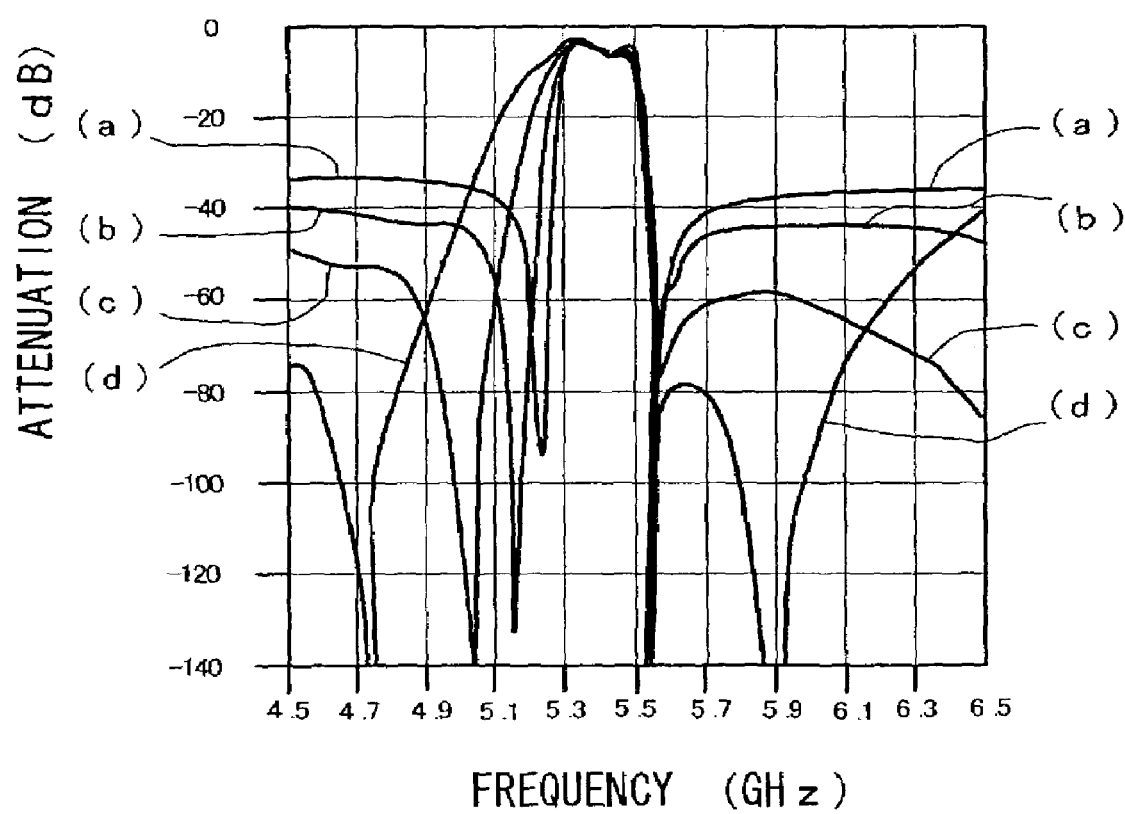
FIG. 16 shows results of simulating the frequency characteristics of the band-pass filter shown in FIG. 14.

FIG. 16 shows the results of simulation of the pass-band frequency characteristics obtained when the inductance elements 221a, 221b and 221c are stepwisely changed to have the following identical inductance values:

(a) 0 nH (the inductance elements are removed)
(b) 0.3 nH
(c) 0.6 nH
(d) 0.9 nH.

Figure 17:
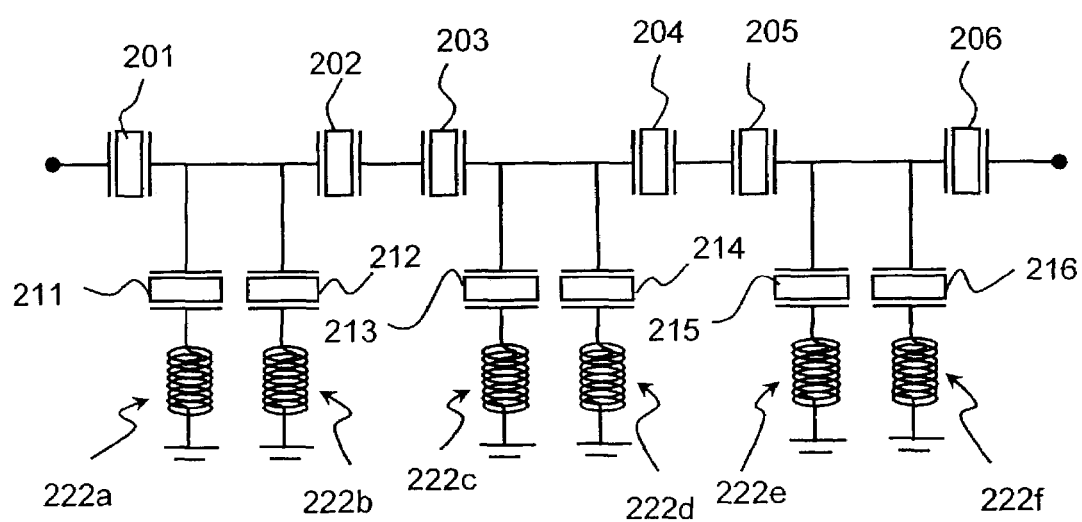
FIG. 17 is a circuit diagram of another circuit configuration in which inductance elements are connected to a band-pass filter.

It can be seen from the simulation results that the degree of suppression to the out-of-pass-band frequencies is more greatly improved as the inductance elements 221a, 221b and 221c connected to the corresponding parallel-arm resonators 211–216 have an increased identical value FIG. 17 is a circuit diagram of an arrangement in which each of the parallel-arm resonators is connected to a respective ground terminal outside of the filter chip via a respective inductance element. More particularly, the parallel-arm resonator 211 is connected to the corresponding external ground terminal via an inductance element 222a, and the parallel-arm resonator 212 is connected to the corresponding external ground terminal via an inductance element 222b. The parallel-arm resonator 213 is connected to the corresponding external ground terminal via an inductance element 222c, and the parallel-arm resonator 214 is connected to the corresponding external ground terminal via an inductance element 222d. Further, the parallel-arm resonator 215 is connected to the corresponding external ground terminal via an inductance element 222e, and the parallel-arm resonator 216 is connected to the corresponding external ground terminal via an inductance element 222f.

Figure 18:
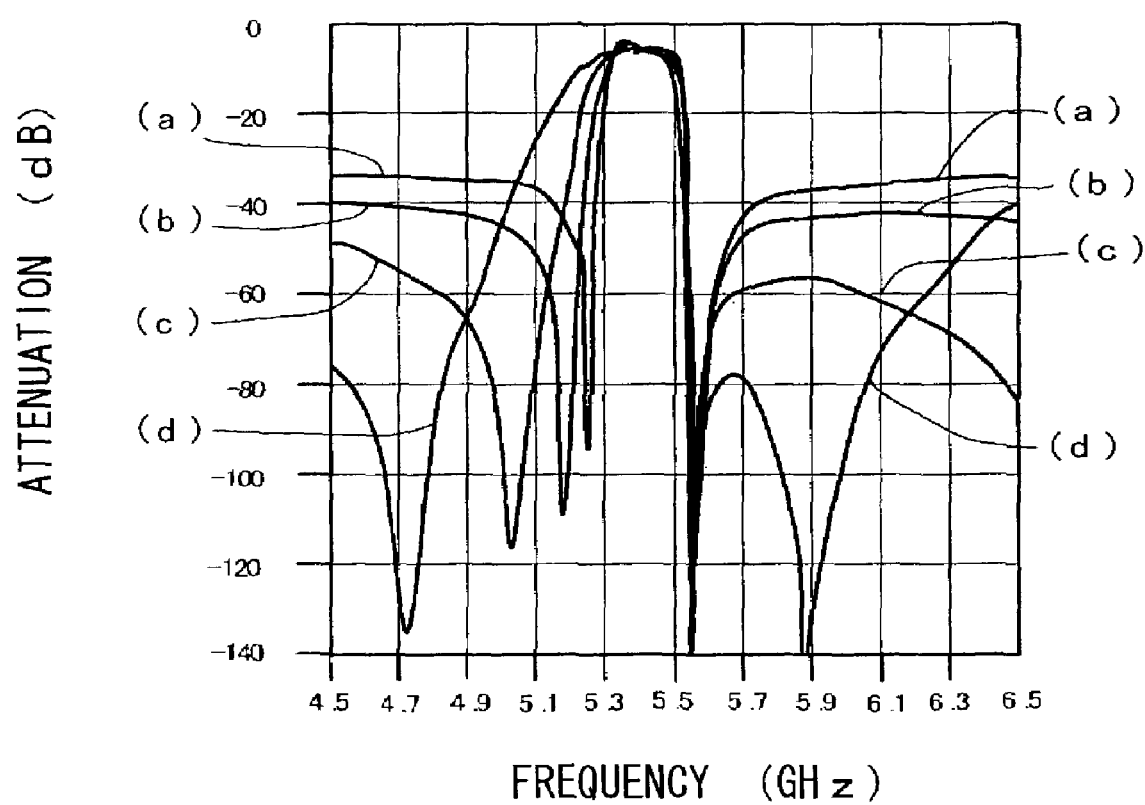
FIG. 18 shows results of simulating the frequency characteristics of the band-pass filter shown in FIG. 17.

FIG. 18 shows the results of simulation of the pass-band frequency characteristics obtained when the inductance elements 222a–222f is stepwisely changed to have the following identical inductance values:

(a) 0 nH (the inductance elements are removed)
(b) 0.6 nH
(c) 1.2 nH
(d) 1.8 nH.

It can be seen from the simulation results that the degree of suppression to the out-of-pass-band frequencies is more greatly improved as the inductance elements 222a–222f connected to the corresponding parallel-arm resonators 211–216 have an increased identical value.

It can be seen from comparison among the simulation results (FIGS. 14, 16 and 18) that, as the number of parallel-arm resonators to be commonly connected to one inductance element increases, the degree of suppression to the out-of-pass-band frequencies can be improved more greatly even when the above inductance value has a relatively small value.

More particularly, in the case shown in FIGS. 15 and 16 where the parallel-resonators in the filter chip are paired and connected to the corresponding common lines, which are connected to the corresponding external ground terminals via the corresponding inductance elements, these inductance elements have inductance values that are approximately equal to half those of the inductance elements, each of which is connected between the respective resonator and the respective external ground terminal as shown in FIGS. 17 and 18, nevertheless the degree of suppression to the out-of-pass-band frequencies in the case shown in FIGS. 15 and 16 is approximately equal to that in the case shown in FIGS. 17 and 18.

In the case shown in FIGS. 13 and 14 in which all the parallel-arm resonators are connected to the common line 15, which is connected to the external ground terminal via the single inductance element, it is possible to obtain, by setting an extremely small inductance of 0.04 nH in the single inductance element, almost the same out-of-passband suppression as that in the case shown in FIGS. 17 and 18 in which each inductance element is set equal to 0.6 nH or in the case shown in FIGS. 15 and 16 in which each inductance element is set equal to 0.3 nH. It should be noted that an inductance of 0.04 nH is approximately one tenth of 0.3 nH and 0.6 nH. In addition, such an extremely small inductance can be used without considerably degrading the signal loss in in-band frequencies on the high-frequency side of the pass-band range.

From the above-mentioned consideration, the arrangement in which multiple parallel-arm resonators are connected to the common line serving as the ground line in the filter chip is advantageous to improvements in the degree of suppression to the frequencies outside of the pass-band frequency range. That is, the desired degree of out-of-passband frequency suppression is achieved by a comparatively small inductance to be connected to the filter chip. In other words, when an inductance as large as the conventionally used inductance is applied to the arrangement in which multiple resonators in parallel arms are gathered and connected to the common line, an extremely high degree of suppression to the frequencies out of the pass band can be provided. Particularly, it is preferable to connect all the parallel-arm resonators to the single common line 16 as shown in FIGS. 10 and 13 through 18, and it is more preferable to form the common line 15 into a ring shape as shown in FIGS. 2 and 3 (see FIG. 12).

A further description will now be given of the relation between the ring-shaped common line 15 and the lower electrodes (for example, the lower electrode 14 shown in FIG. 3) of the parallel-arm resonators 211–216 integrally formed with the common line 15.

Figure 19:
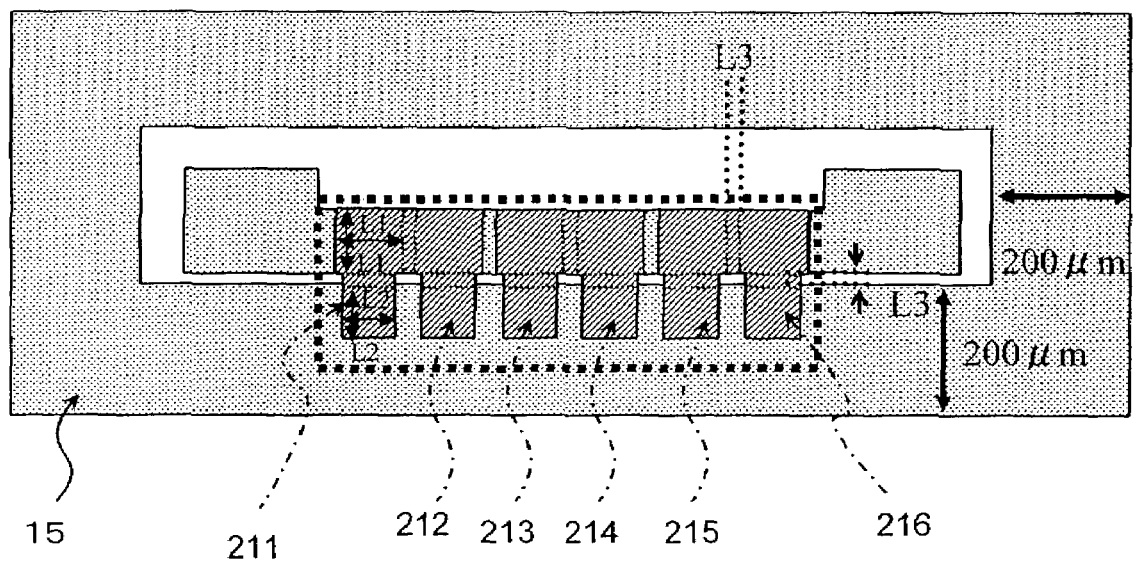
FIG. 19 shows a relation between a common line and lower electrodes of parallel-arm resonators integrally formed therewith.

In an arrangement shown in FIG. 19, the lower electrodes of the parallel-arm resonators 211–216 are included in the substantive ring-shaped portion or body of the ring-shaped common line 15. The structure of the filter chip in this arrangement has the same as that of the filter chip shown in FIGS. 2 and 3 except the relation between the common line 15 and the lower electrodes of the parallel-arm resonators 211–216. For example, the width of the ring-shaped common line 15 may be set equal to 200 μm.

Figure 20:
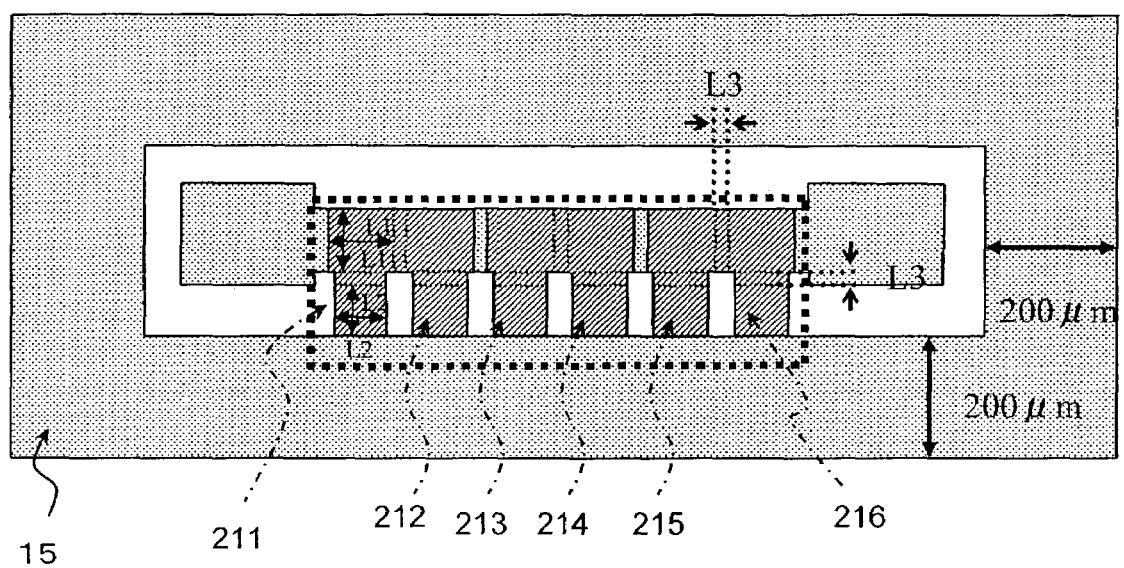
FIG. 20 shows another relation between the common line and lower electrodes of parallel-arm resonators integrally formed therewith.

In an arrangement shown in FIG. 20, like the filter chip shown in FIGS. 2 and 3, the lower electrodes of the parallel-arm resonators 211–216 are formed integrally with the common line 15 without overlapping the parallel-arm resonators 211–216 with the ring-shaped common line 15. Even in this arrangement, the width of the ring-shaped common line 15 may be set equal to 200 μm.

Figure 21:
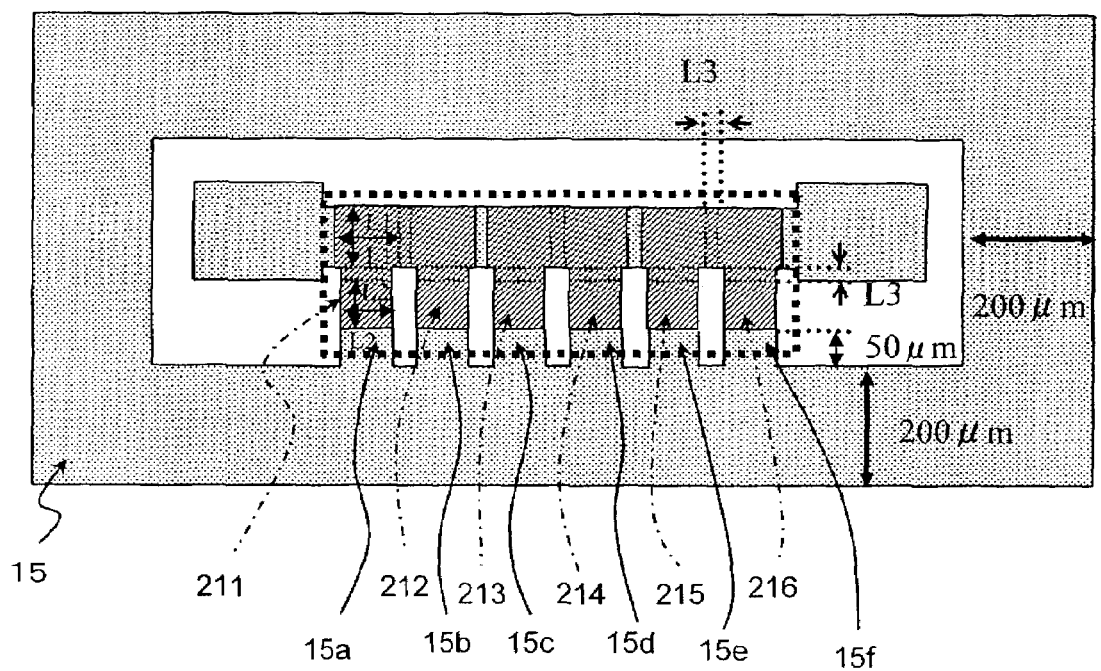
FIG. 21 shows yet another relation between the common line and lower electrodes of parallel-arm resonators integrally formed therewith.

In an arrangement shown in FIG. 21, the ring-shaped common line 15 is provided with extensions 15a–15f, which correspond to the parallel-arm resonators 211–216, respectively. The lower electrodes of the parallel-arm resonators 211–216 are formed integrally with the common line 15 via the extensions 15a–15f, respectively. In this arrangement, for example, the widths of the extensions 15a–15f may be set equal to 50 μm, and the width of the common line 15 may be set equal to 200 μm.

Figure 22:
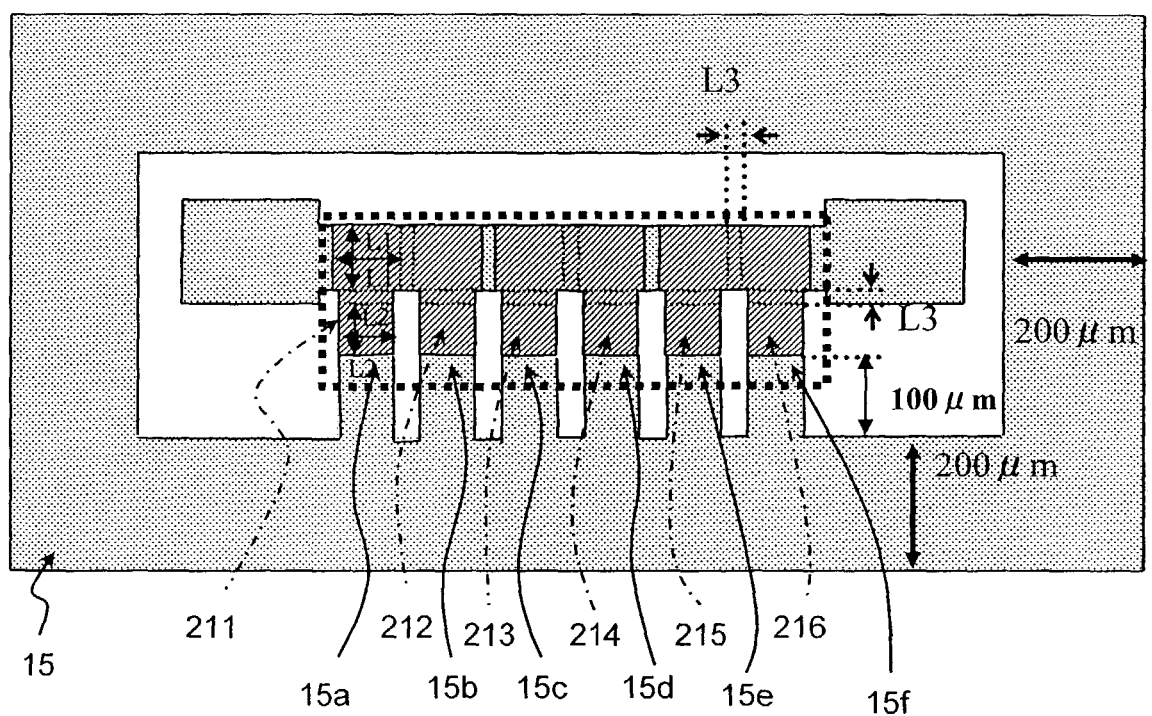
FIG. 22 shows a further relation between the common line and lower electrodes of parallel-arm resonators integrally formed therewith.

In an arrangement shown in FIG. 22, like the arrangement shown in FIG. 21, the ring-shaped common line 15 is provided with the extensions 15a–15f that correspond to the parallel-arm resonators 211–216, respectively, and the lower electrodes of the parallel-arm resonators 211–216 are formed integrally with the common line 15 via the extensions 15a–15f, respectively. For example, the extensions 15a–15f shown in FIG. 22 may be 100 μm long, and the common line 15 may be 200 μm long. The extensions 15a–15f in FIG. 22 are twice as long as the extensions 15a–15f in FIG. 21.

Figure 23:
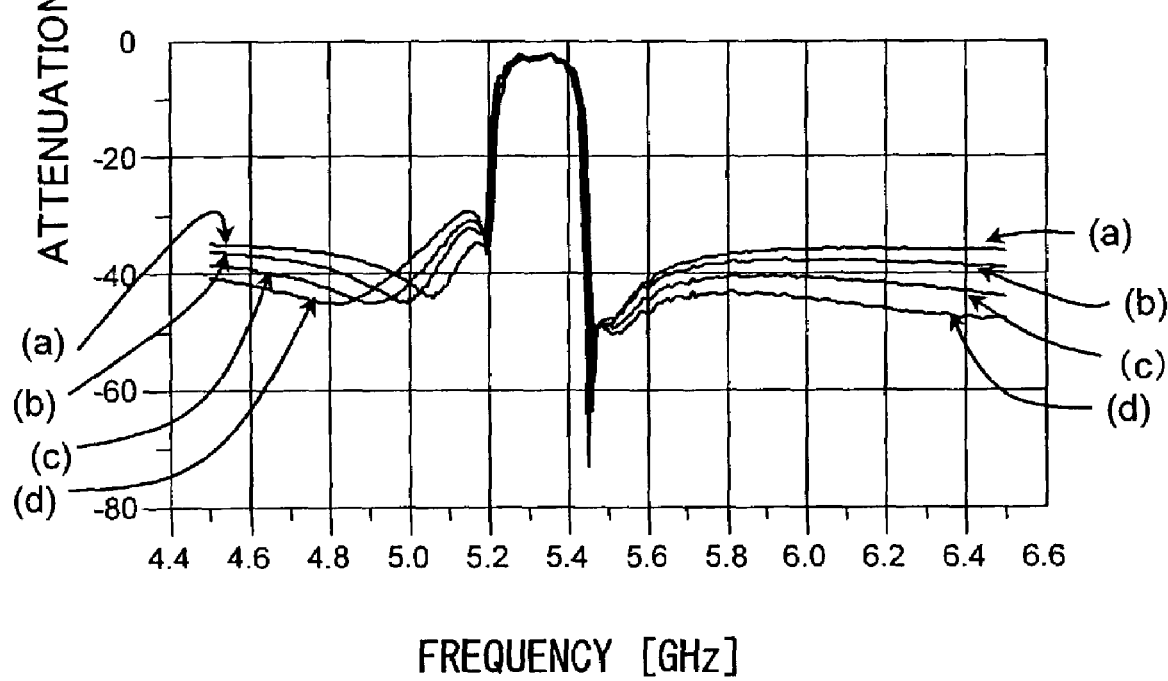
FIG. 23 is a graph of frequency characteristics of the filter chips having the structures shown in FIGS. 19 through 22.

A curve (a) shown in FIG. 23 is the frequency characteristic of the band-pass filter formed in the filter chip having the structure shown in FIG. 19, and a curve (b) shown therein is the frequency characteristic of the band-pass filter formed in the filter chip having the structure shown in FIG. 20. A curve (c) is the frequency characteristic of the band-pass filter having the structure shown in FIG. 21, and a curve (d) is the frequency characteristic of the band-pass filter having the structure shown in FIG. 22.

It can be seen from the frequency characteristics (a), (b), (c) and (d) of FIG. 23 that the degree of suppression to the frequencies out of the pass band is enhanced as the distance between the ring-shaped body of the common line 15 (which does not include the extensions 15a–15f) and the parallel-arm resonators 211–216 increases. It is therefore possible to enhance the stop band attenuation by filling the gaps between the ring-shaped body of the common line 15 and the parallel-arm resonators 211–216 with the extensions 15a–15f having appropriate lengths.

However, the chip area increases as the distance between the ring-shaped body of the common line 15 and the parallel-arm resonators 211–216. This is disadvantageous to the productivity and chip mounting. Taking the above into the consideration, the distance between the ring-shaped body and the parallel-arm resonators 211–216 to be connected by the extensions 15a–15d may be appropriately determined based on the pass-band frequency characteristic, the production cost and the chip mounting condition. In practice, preferably, the distance may be equal to 1 mm or shorter.

In the arrangements shown in FIGS. 21 and 22, the extensions 15a–15f extending from the ring-shaped body of the common line 15 correspond to the parallel-arm resonators one by one. However, the extensions 15a–15f are not limited to the above structure but may have a structure in which one extension is provided to multiple parallel-arm resonators.

A description will now be given of a filter chip according to a third embodiment of the present invention, which differs from the first and second embodiments thereof respectively shown in FIGS. 2 and 3 and FIG. 11 in that the input electrode, the output electrode, the upper electrodes of the resonators, and the common line are formed from the upper electrode film.

Figure 24:
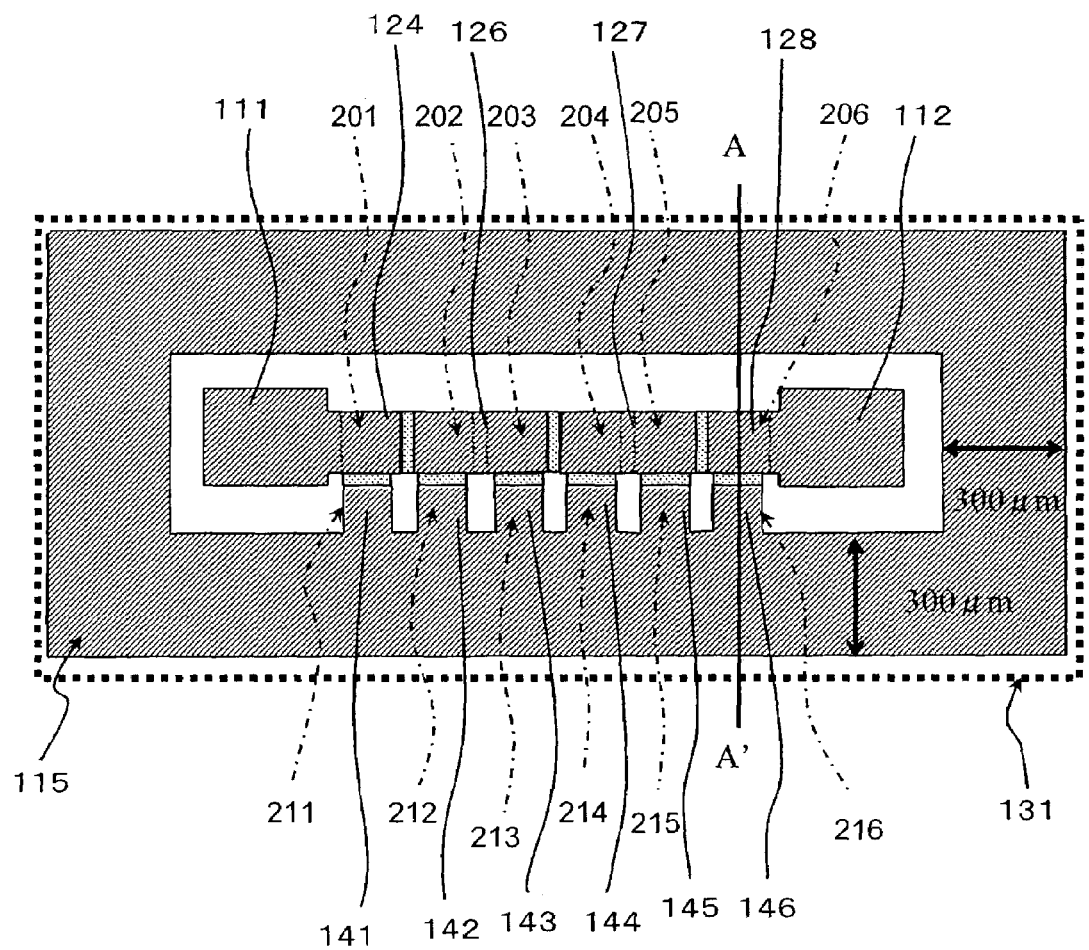
FIG. 24 is a plan view of a filter chip according to a third embodiment of the present invention.
Figure 25:
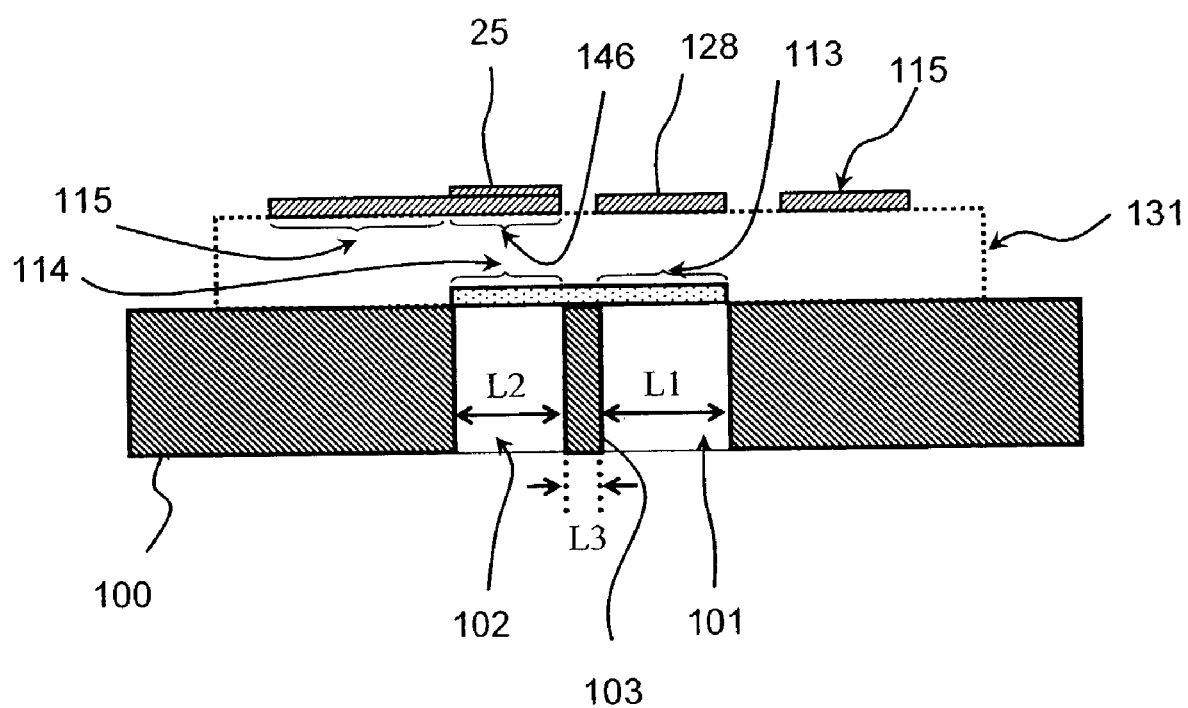
FIG. 25 is a cross-sectional view taken along a line A–A' shown in FIG. 24.

A filter chip according to the third embodiment of the present invention is configured as shown in FIGS. 24 and 25. FIG. 24 is a plan view of this filter chip, and FIG. 25 is a cross-sectional view taken along a line A–A'.

Referring to these figures, the upper electrode film is used to form an input electrode 111, an output electrode 112, the upper electrodes of multiple resonators 201–206 and 211–216, and a common line 115. The series-arm resonator 206 shown in FIG. 24 is composed of an upper electrode 128, a piezoelectric film 131 and a portion 113 of the lower electrode that faces the upper electrode 128, as shown in FIG. 25. The parallel-arm resonator 216 shown in FIG. 24 is composed of an upper electrode 146, the piezoelectric film 131, and a portion 114 of the lower electrode that faces the upper electrode 146.

An upper electrode 124 of the series-arm resonator 201 is integrated with the input electrode 111, and an upper electrode 128 of the series-arm resonator 206 is incorporated with the output electrode 112. An upper electrode 126 serves as the upper electrodes of the two series-arm resonators 202 and 203, and similarly, an upper electrode 127 serves as the upper electrodes of the series-arm resonators 204 and 205. The lower electrodes of the series-arm resonators 201 and 202 and those of the parallel-arm resonators 211 and 212 are integrally formed. The lower electrodes of the series-arm resonators 203 and 204 and those of the parallel-arm resonators 213 and 214 are integrally formed. The lower electrodes of the series-arm resonators 205 and 206 and those of the parallel-arm resonators 215 and 216 are integrally formed. The common line 115 formed by the upper electrode film is integrally formed with upper electrodes 141, 142, 143, 144, 145 and 146 of the parallel-arm resonators 211 through 216. The common line 115 has a ring shape formed on the piezoelectric film 131, and encloses the series-arm resonators 201–206, the parallel-arm resonators 211–216, the input electrode 111 and the output electrode 112.

For example, the filter chip shown in FIGS. 24 and 25 has the circuit configuration shown in FIG. 1.

A conductive film layer 25 for frequency adjustment may be provided on each of the upper electrodes 141–146 of the parallel-arm resonators 211–216, as shown in FIG. 25. Like the filter chip shown in FIGS. 2 and 3, the respective cavity 101 having a rectangular cross section is formed in the silicon substrate 101 so as to be located just below each of the series-arm resonators 201–206. One side of the cavity 101 is L1 long. Similarly, the respective cavity 102 having a rectangular cross section is formed in the silicon substrate 101 so as to be located just below each of the parallel-arm resonators 211–216 having one side of L2. Each boundary portion between the cavities 101 below two adjacent series-arm resonators is the partition wall 103 having thickness L3. Similarly, each boundary portion between the cavity 101 below a series-arm resonator and the cavity 102 below a parallel-arm resonator is the partition wall 103 having the thickness L3.

The filter chip shown in FIGS. 24 and 25 may have a size described below. The common line 115 is 300 μm wide. One side L1 of each cavity 101 is 65 μm long, and one side L2 of each cavity 102 is 50 μm long. The thickness L3 of each partition wall 103 is 20 μm.

The common line 115 formed from the upper electrode film is externally grounded, so that the frequencies out of the pass band can be suppressed greatly as shown in FIGS. 12 and 23 like the filter chip of the first embodiment shown in FIGS. 2 and 3.

The filter chip shown in FIGS. 24 and 25 may be fabricated by a process similar to that of the first embodiment shown in FIGS. 4 through 10.

A description will now be given of a filter chip according to a fourth embodiment of the present invention, which is intended to further improve the filter characteristics by reducing the wiring or interconnection resistance.

Figure 10:
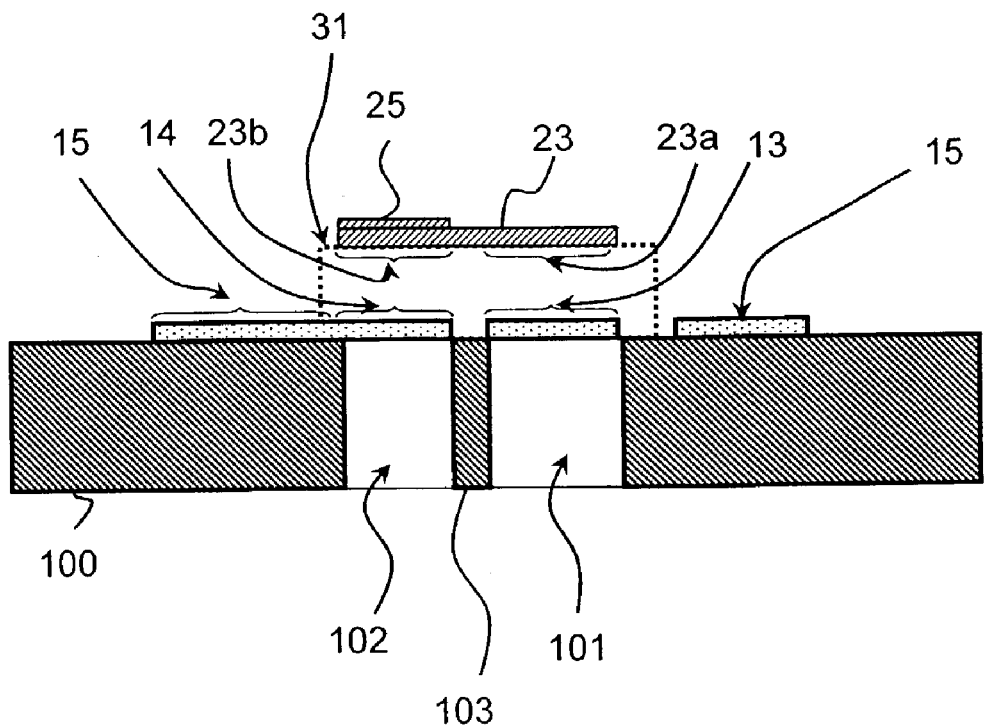
FIG. 10 illustrates the seventh step of the fabrication method.
Figure 11:
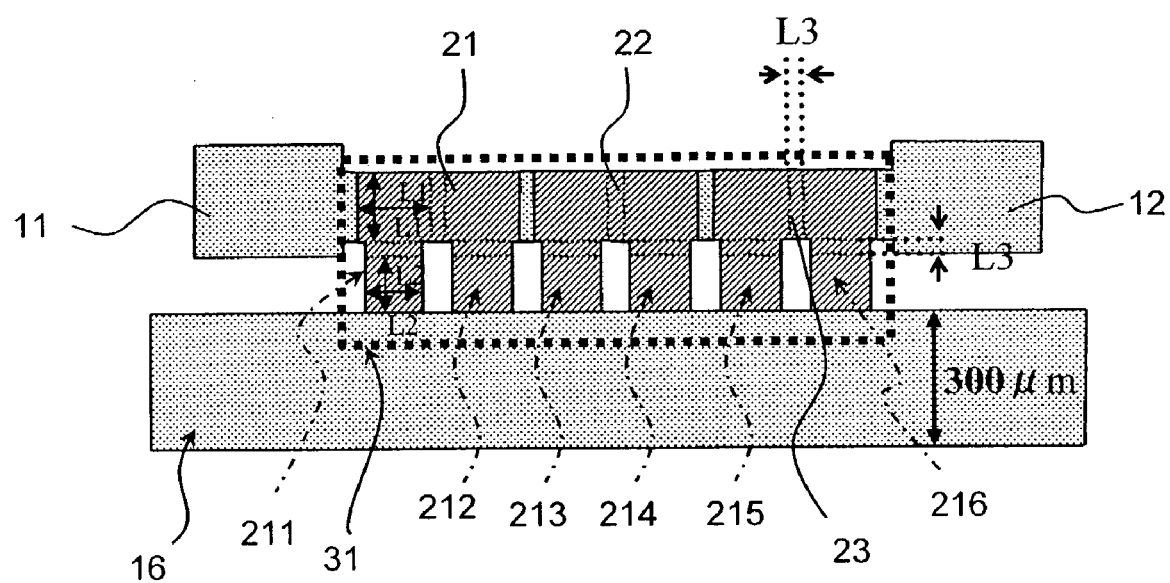
FIG. 11 is a plan view of a filter chip according to a second embodiment of the present invention.
Figure 26:
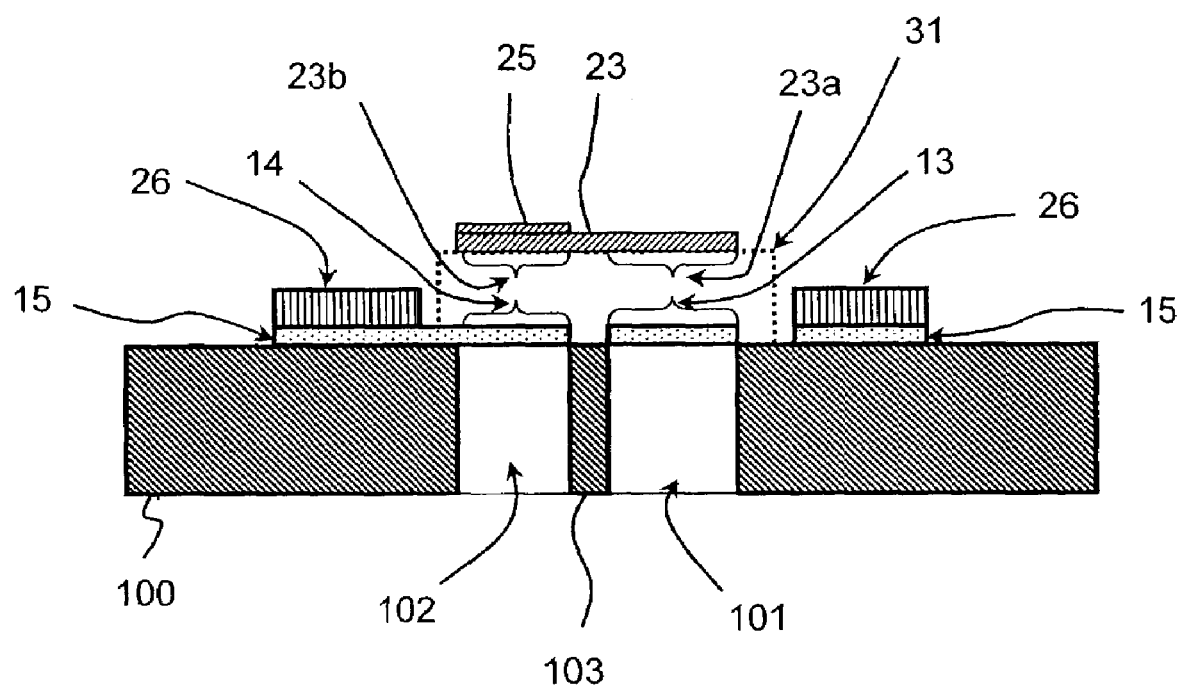
FIG. 26 is a cross-sectional view of a filter chip according to a fourth embodiment of the present invention.

In the process of fabricating the filter chip according to the first embodiment of the present invention shown in FIGS. 4 through 10, the conductive layer for use in frequency adjustment, the upper electrode film 20 and the piezoelectric film 30 are patterned into the respective shapes as shown in FIG. 9, and thereafter, a conductive laminate pattern of gold (Au: 150 nm) and titanium (Ti: 200 nm) is partially or totally formed by liftoff on an area except areas in which the resonators formed from the upper electrode film 20 and the lower electrode film 10 are to be formed. Thus, as is shown in FIG. 26, an electrically conductive pattern or layer 26 is formed on the surface of the common line 15 formed from the lower electrode film. After the conductive layer 26 is formed on the common line 15, the cavities 101 and 102 associated with the resonators are formed as shown in FIG. 10.

The conductive layer 26 enables forming of bumps for flip-chip bonding. The conductive layer 26 may be totally or partially formed on the wiring patterns that do not affect the resonance performance. The conductive layer 26 may be formed on the entire surface of the common line 15 or a part thereof. The conductive layer 26 reduces the wiring resistance and improves the filter characteristics.

The conductive layer is not limited to a laminate of gold and titanium but may be a laminate of other materials or a single layer.

Figure 27:
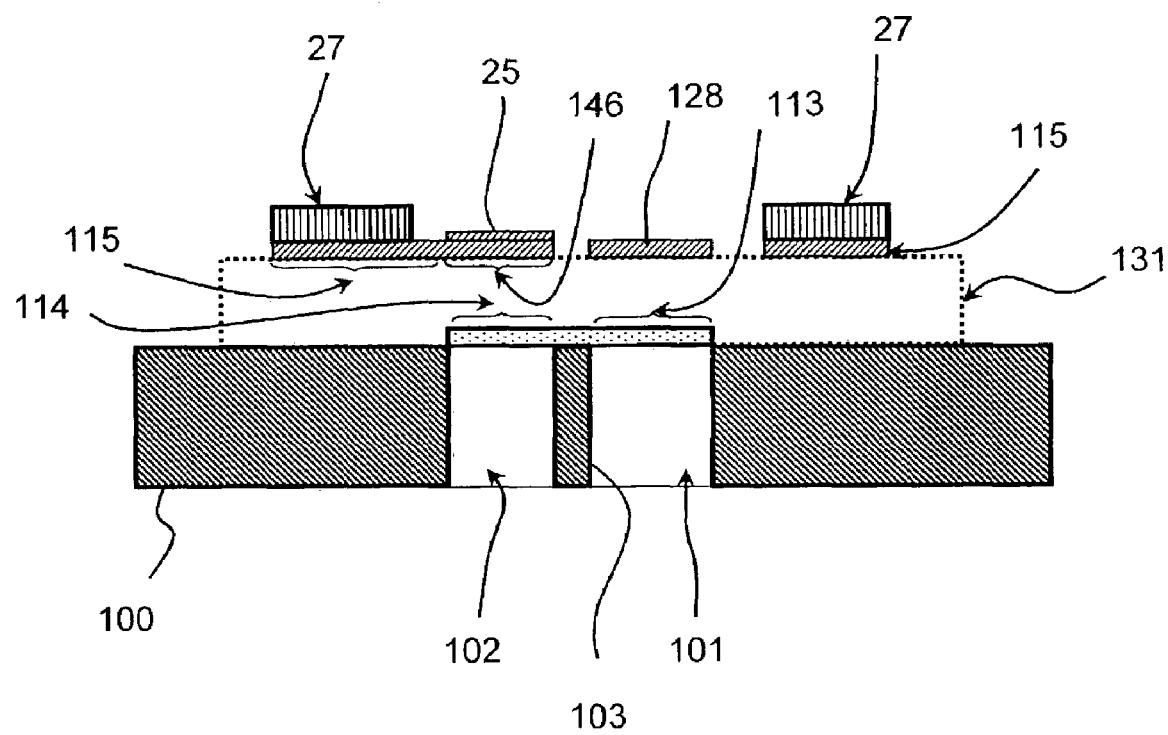
FIG. 27 is a cross-sectional view of a variation of the fourth embodiment of the present invention.

A conductive film layer like the conductive film layer 26 may be provided to the filter chip of the third embodiment of the present invention (see FIGS. 24 and 25) by the same process as has been mentioned previously. In this case, as shown in FIG. 27, a laminate 27 of gold and titanium is formed on the common line 115 formed from the upper electrode film. The conductive layer 27 thus formed reduces the resistance of the common line 115 and improves the filter characteristics.

A description will now be given, with reference to FIGS. 28 through 30, of packaging of the filter chips mentioned before. FIG. 29 is a cross-sectional view taken along a line A–A' shown in FIG. 28.

Figure 28:
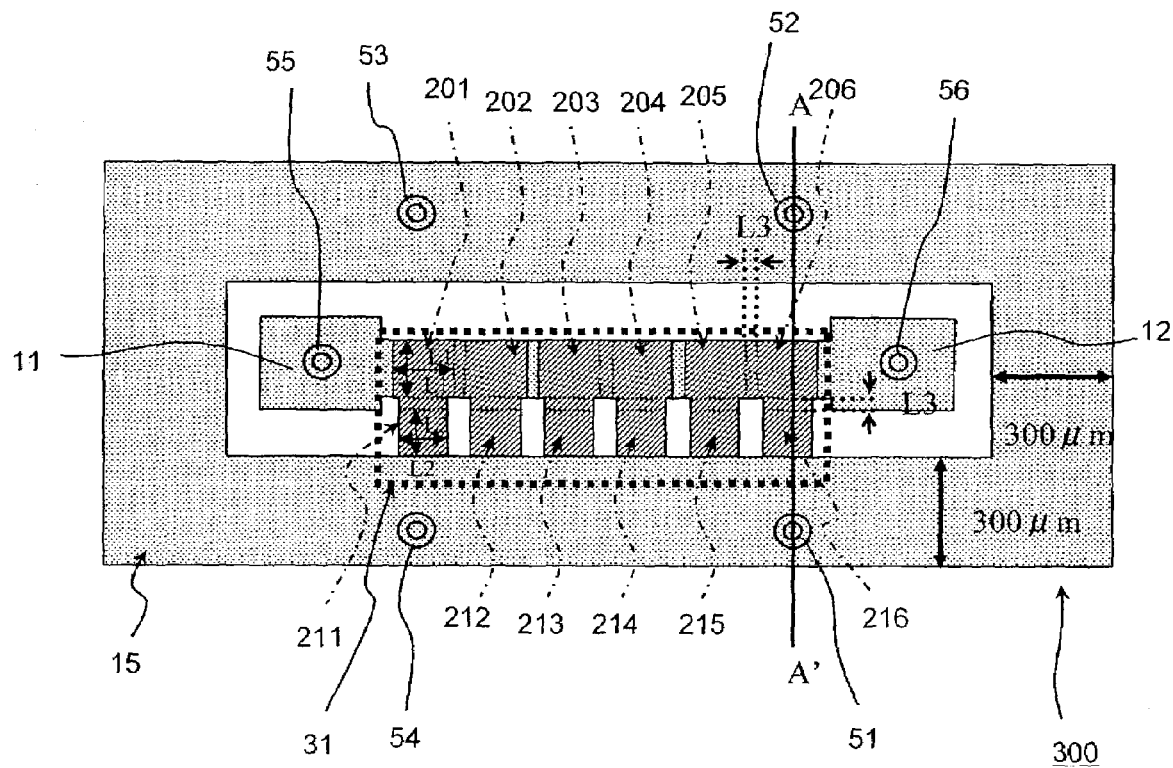
FIG. 28 is a plan view of a filter chip wherein bumps are provided.
Figure 29:
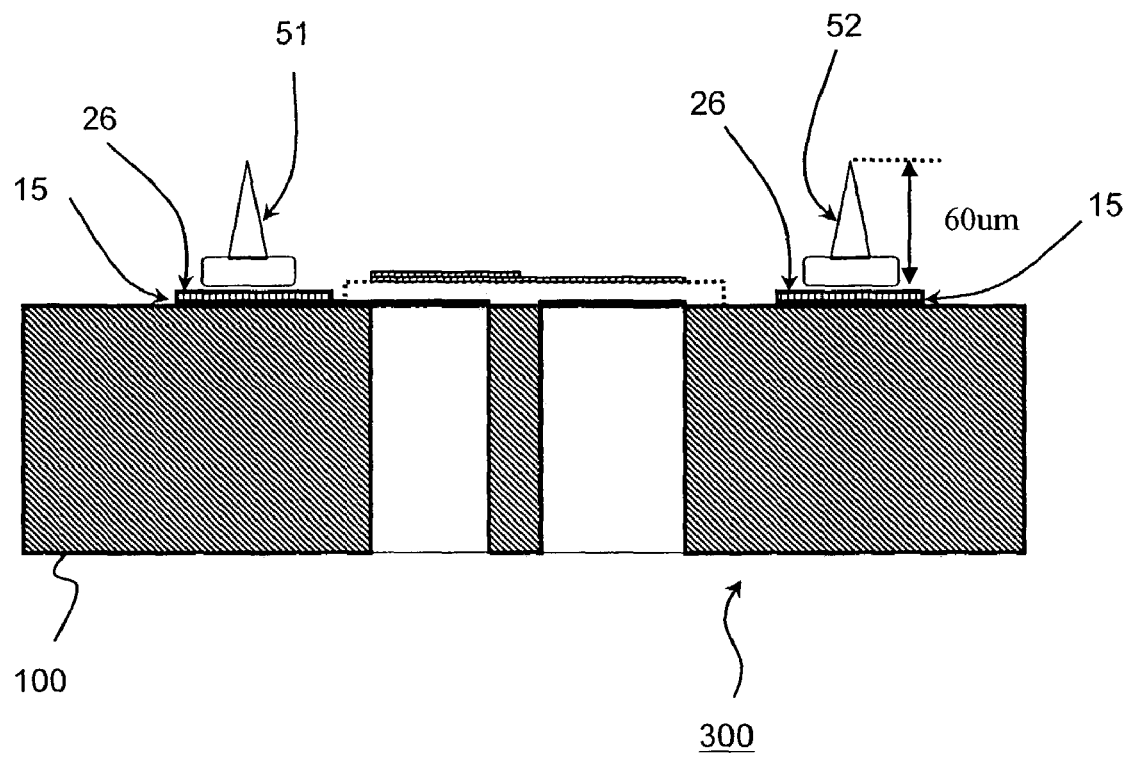
FIG. 29 is a cross-sectional view taken along a line A–A' shown in FIG. 28.

Referring to FIGS. 28 and 29, a filter chip 300 has the same structure as the filter chip shown in FIGS. 2 and 3. The filter chip 300 includes the common line 15, the input electrode 11 and the output electrode 12, on which the conductive layer 26 shown in FIG. 26 are provided. Bumps 51, 52, 53 and 54 are formed on the common line 15 and are located in given positions. Bumps 55 and 56 are provided on the input electrode 11 and the output electrode 12. For example, the bumps 51 through 56 are 60 µm high.

Figure 30:
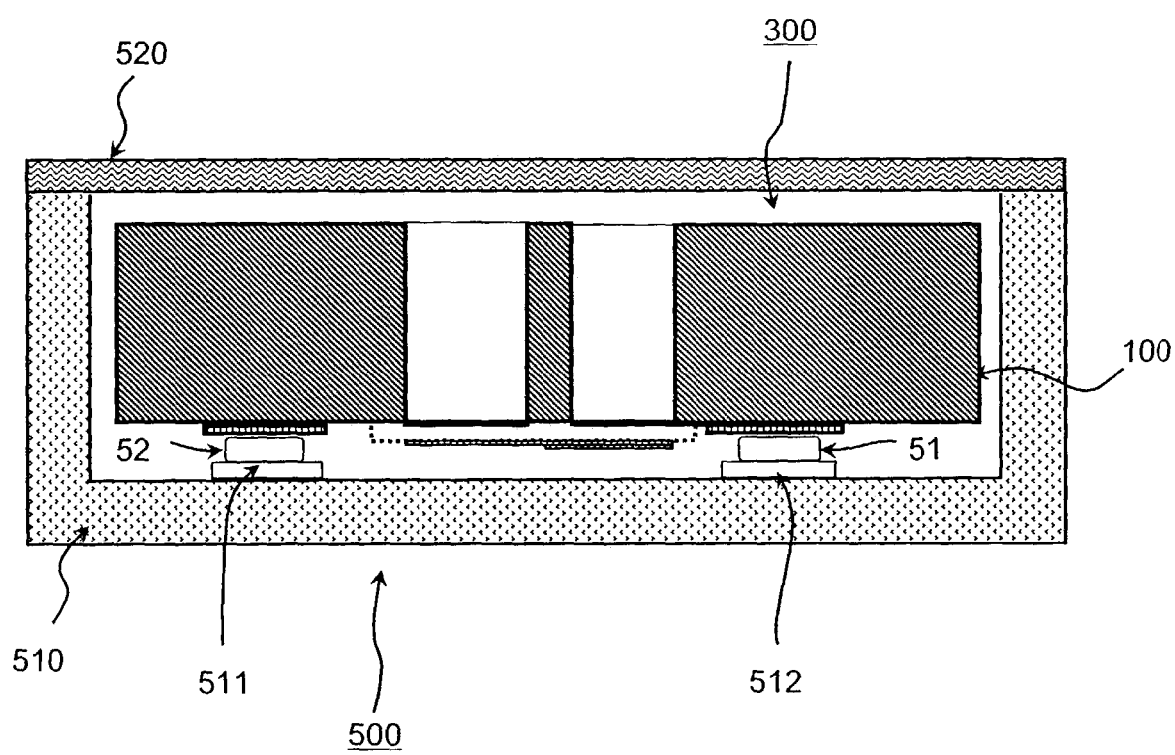
FIG. 30 is a cross-sectional view of a filter device wherein the filter chip shown in FIGS. 28 and 29 are accommodated in a casing.

The filter chip 300 thus configured is accommodated in a package 500 shown in FIG. 30. The package 500 includes a casing 510 and a cap 520. Pads 511 and 512 for extraction lines are provided to the casing 510. The pads 511 and 512 are located in positions so that when the filer chip 300 is placed in position in the casing 510, the bumps 51–56 can be brought into contact with the pads 511 and 512. It is to be noted that only two bumps 511 and 512 are illustrated in FIG. 30. The bumps 51–56 are bonded to the pads 511 and 512 by thermo-compression bonding with the filter chip 300 being placed in position in the casing 510. For instance, the bumps 511 and 512 connected to the common line 15 are jointed to the pads 511 and 512, which are connected to ground terminals for making external connections (not shown in FIG. 30) mounted on the package 500. Thus, the lower electrodes of the parallel-arm resonators 211–216 of the filter chip 300 are electrically connected to the ground terminals on the package 500 via the common line 15, the bumps 51–54 and the pads 511 and 512 on the casing 510.

The cap 520 is attached to the casing 510 in which the filter chip 300 has been accommodated, so that the filter chip 300 can be encapsulated and hermetically sealed in the package 500.

The filter device thus configured has highly improved out-of-band suppression, which results from the unique arrangements of the filter chip 300, as shown in FIGS. 12 and 23. Thus, the filter chip 300 and the ground pads or terminals on the package 500 are not required to be connected by wires in order to secure a sufficient inductance by these wires.

The resonators in the aforementioned embodiments of the present inventions employ piezoelectric thin-film. However, the present invention is not limited to the piezoelectric thin-film resonators but may include a band-pass filter equipped with multiple surface acoustic wave (SAW) resonators. This kind of filter chip is illustrated in FIG. 31.

Figure 31:
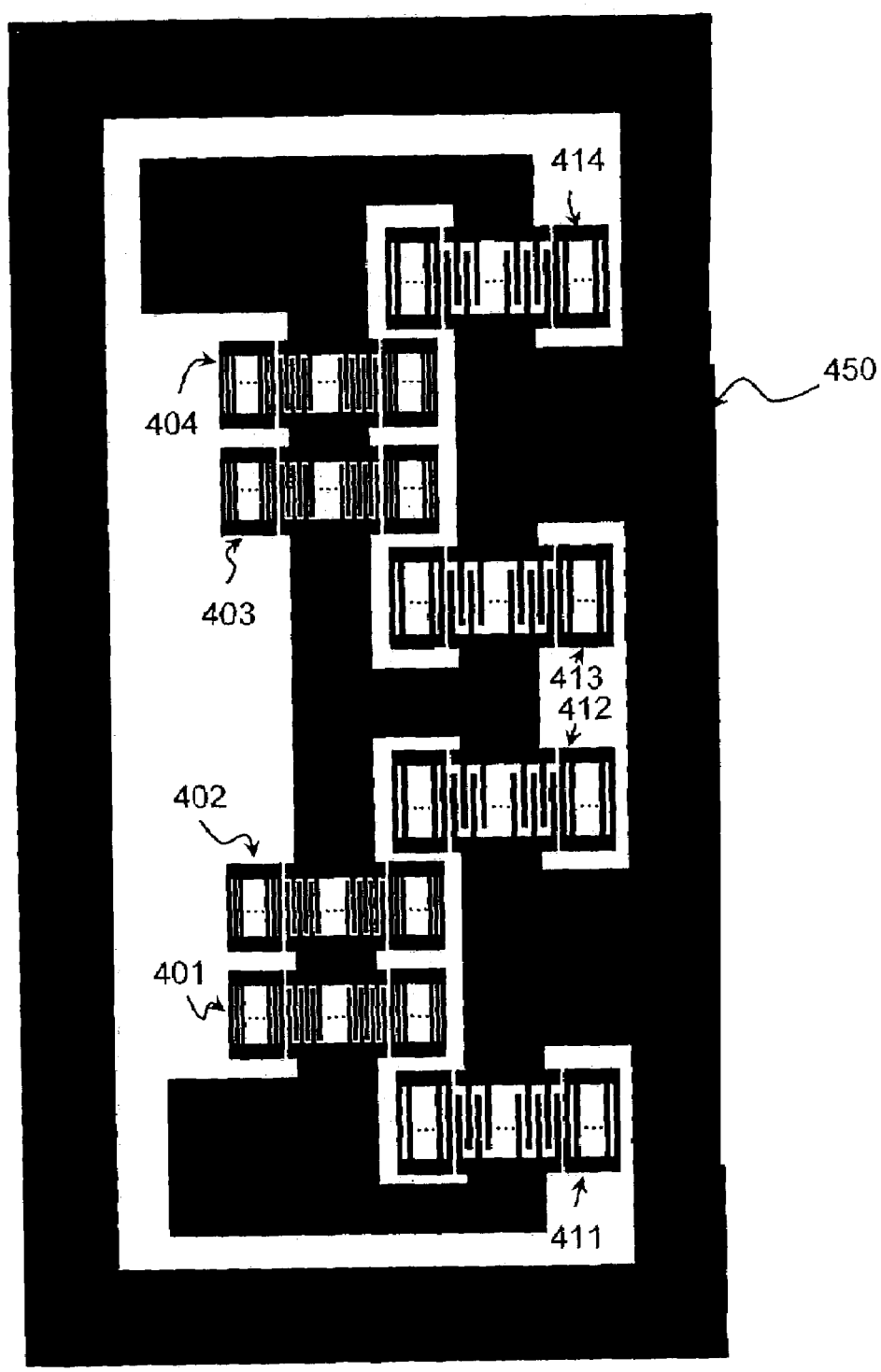
FIG. 31 is a plan view of a filter chip wherein multiple surface acoustic wave resonators are combined in a ladder arrangement.

Referring to FIG. 31, SAW resonators 401, 402, 403 and 404 are provided in series arms of a ladder type SAW filter, and SAW resonators 411, 412, 413 and 414 are provided in parallel arms thereof. Each of the resonators 401–404 and 411–414 has a pair of comb-like electrodes. One of each pair of comb-like electrodes of the parallel-arm SAW resonators 411–414 is connected to a signal line formed by the series-arms, and the other comb-like electrodes thereof are integrally formed with a common line 450. The common line 450 is a ring-shaped thin-film pattern that surrounds the resonators 401–404 and 411–414 in the filter chip.

The present invention is not limited to the specifically described embodiments, and other embodiments, variations and modifications may be made without departing from the scope of the present invention. For example, besides the arrangements shown in FIGS. 15 and 16, only two or more parallel-arm resonators among the parallel-arm resonators of the filter chip may be connected to the common line. This variation corresponds to a combination of the arrangements shown in FIGS. 15 and 17.

The specifically described filters are band-pass filters. However, the present invention includes low-pass filters and high-pass filters.

In the foregoing, each lower or upper electrode is commonly provided to two or more parallel-arm resonators, and is connected to the common line. Alternatively, the lower or upper electrode of only one of the parallel-arm resonators may be connected to the ring-shaped common line. In this case, the lower or upper electrodes of the parallel-arm resonators other than the parallel-arm resonator connected to the ring-shaped common line may be separately connected to given wiring portions (pads) or may be connected to the common line. It is also possible to separately connect the upper or lower electrode of each of the other parallel-arm resonators to the ring-shaped common line.

According to one aspect of the present invention, the common line is connected to the external ground terminal, and the inductance of the common line and that of the connecting member that connects the common line and the external ground terminal are added. With the added inductance, the filter chip operates. Therefore, the connecting member having a relatively small inductance can be used to realize a high degree of suppression to the frequencies out of the pass band.

The present invention is based on Japanese Patent Application No. 2002-097083 filed on Mar. 29, 2003, the entire disclosure of which is hereby incorporated by reference.

What is claimed is:

1. A filter chip comprising:
multiple series-arm resonators arranged in series arms of a ladder arrangement;
multiple parallel-arm resonators arranged in parallel arms of the ladder arrangement; and
a common line connected to first electrodes of at least two parallel-arm resonators among the multiple parallel-arm resonators, second electrodes of said at least two parallel-arm resonators being connected to associated series-arm resonators among the multiple series-arm resonators, wherein:
the multiple series-arm resonators are arranged in line from an input electrode of the filter chip to an output electrode thereof;
the multiple parallel-arm resonators are aligned with the multiple series-arm resonators; and
the second electrodes of the multiple parallel-arm resonators are integrally formed with electrodes of any of the multiple series-arm resonators.

2. The filter chip as claimed in claim 1, wherein first electrodes of all the multiple parallel-arm resonators are connected to the common line.

3. The filter chip as claimed in claim 1, wherein the common line has a ring shape.

4. The filer chip as claimed in claim 1, wherein the common line is arranged so as to surround the multiple series-arm resonators and the multiple parallel-arm resonators.

5. The filter chip as claimed in claim 1, wherein the common line is a conductive thin-film.

6. The filter chip as claimed in claim 1, wherein:
the common line is a conductive thin-film; and
a conductive layer is provided on the common line.

7. The filter chip as claimed in claim 1, wherein the common line is made of a material identical to that of the first electrodes of the multiple parallel-arm resonators, and is integrally formed with the first electrodes of the multiple parallel-arm resonators.

8. The filter chip as claimed in claim 1, wherein the common line has extensions that extend from a body of the common line toward the first electrodes of the multiple parallel-arm resonators.

9. The filter chip as claimed in claim 1, wherein the common line has extensions that extend from a body of the common line and reach the first electrodes of the multiple parallel-arm resonators.

10. The filter chip as claimed in claim 1, wherein the multiple series-arm resonators and the multiple parallel-arm resonators form a band-pass filter.

11. The filter chip as claimed in claim 1, wherein the common line has a ring shape that surrounds all the multiple series-arm resonators, all the multiple parallel-arm resonators, and an input electrode of the filter chip and an output electrode of the filter chip.

12. The filter chip as claimed in claim 1, wherein the multiple series-arm resonators and the multiple parallel arm resonators are piezoelectric thin-film resonators.

13. The filter chip as claimed in claim 1, wherein the common line is formed by a thin film that also forms the first electrodes of the multiple parallel-arm resonators.

14. The filter chip as claimed in claim 1, wherein:
the filter chip comprises a substrate, and a laminate formed on the substrate;
the laminate comprises a layer that forms the first electrodes of the multiple parallel-arm resonators and another layer that forms the second electrodes thereof; and
the common line is formed by said layer.

15. The filter chip as claimed in claim 1, wherein the second electrodes of the multiple parallel-arm resonators are closer to a substrate of the filter chip than the first electrodes thereof.

16. The filter chip as claimed in claim 1, wherein:
the multiple series-arm resonators and the multiple parallel-arm resonators are formed on a substrate; and
the substrate has cavities via which electrodes of the multiple series-arm resonators and either the first or second electrodes of the multiple parallel-arm resonators are exposed via the cavities from a backside of the substrate.

17. The filter chip as claimed in claim 1, wherein the multiple series-arm resonators and the multiple parallel-arm resonators are respectively surface acoustic wave resonators.

18. A filter chip comprising:
multiple series-arm resonators arranged in series arms of a ladder arrangement;
multiple parallel-arm resonators arranged in parallel arms of the ladder arrangement; and
a common line connected to first electrodes of at least two parallel-arm resonators among the multiple parallel-arm resonators, second electrodes of said at least two parallel-arm resonators being connected to associated series-arm resonators among the multiple series-arm resonators,
wherein the second electrodes of the multiple parallel-arm resonators are farther from a substrate of the filter chip than the first electrodes thereof.

19. A filter device comprising:
a package; and
a filter chip accommodated in the package, the filter chip comprising:
multiple series-arm resonators arranged in series arms of a ladder arrangement;
multiple parallel-arm resonators arranged in parallel arms of the ladder arrangement; and
a common line connected to first electrodes of at least two parallel-arm resonators among the multiple parallel-arm resonators, second electrodes of said at least two parallel-arm resonators being connected to associated series-arm resonators among the multiple series-arm resonators,
wherein the common line is connected to pads provided on the package by connecting members;
the multiple series-arm resonators are arranged in line from an input electrode of the filter chip to an output electrode thereof;
the multiple parallel-arm resonators are aligned with the multiple series-arm resonators; and
the second electrodes of the multiple parallel-arm resonators are integrally formed with electrodes of any of the multiple series-arm resonators.

20. The filter device as claimed in claim 19, wherein the connecting members are bumps interposed between the common line and the pads.

21. The filter device as claimed in claim 19, wherein:
the connecting members are bumps interposed between the common line and the pads; and
the filter chip is accommodated in the package in face-down mounting.

22. The filter device as claimed in claim 19, further comprising a cap attached to the package, so that the filter chip is hermetically sealed.

23. A filter chip comprising:
multiple series-arm resonators arranged in series arms of a ladder arrangement;
multiple parallel-arm resonators arranged in parallel arms of the ladder arrangement; and
a common line connected to first electrodes of at least two parallel-arm resonators among the multiple parallel-arm resonators, second electrodes of said at least two parallel-arm resonators being connected to associated series-arm resonators among the multiple series-arm resonators,
the common line having a ring shape provided so as to surround the multiple series-arm resonators and the multiple parallel-arm resonators,
wherein the common line has a linear portion to which the first electrodes of all the multiple parallel-arm resonators are connected.

24. A filter chip comprising:
multiple series-arm resonators arranged in series arms of a ladder arrangement;
multiple parallel-arm resonators arranged in parallel arms of the ladder arrangement; and
a common line connected to first electrodes of at least two parallel-arm resonators among the multiple parallel-arm resonators, second electrodes of said at least two parallel-arm resonators being connected to associated series-arm resonators among the multiple series-arm resonators,
wherein the common line has a closed loop having a linear portion to which the first electrodes of all the multiple parallel-arm resonators are connected.

* * * * *